(12) United States Patent
Ober et al.

(10) Patent No.: US 9,063,420 B2
(45) Date of Patent: Jun. 23, 2015

(54) PHOTORESIST COMPOSITION, COATED SUBSTRATE, AND METHOD OF FORMING ELECTRONIC DEVICE

(71) Applicants: ROHM AND HAAS ELECTRONIC MATERIALS LLC, Marlborough, MA (US); DOW GLOBAL TECHNOLOGIES LLC, Midland, MI (US)

(72) Inventors: Matthias S. Ober, Midland, MI (US); Vipul Jain, Westborough, MA (US); John B. Etienne, Mount Pleasant, MI (US)

(73) Assignees: ROHM AND HAAS ELECTRONIC MATERIALS LLC, Marlborough, MA (US); DOW GLOBAL TECHNOLOGIES LLC, Midland, MI (US)

( * ) Notice: Subject to any disclaimer, the term of this patent is extended or adjusted under 35 U.S.C. 154(b) by 27 days.

(21) Appl. No.: 13/943,007

(22) Filed: Jul. 16, 2013

(65) Prior Publication Data
US 2015/0021289 A1 Jan. 22, 2015

(51) Int. Cl.
*G03F 7/039* (2006.01)
*G03F 7/09* (2006.01)
*G03F 7/30* (2006.01)
*G03F 7/36* (2006.01)

(52) U.S. Cl.
CPC .............. *G03F 7/0392* (2013.01); *G03F 7/039* (2013.01); *G03F 7/0395* (2013.01); *G03F 7/0397* (2013.01); *G03F 7/09* (2013.01); *G03F 7/30* (2013.01); *G03F 7/36* (2013.01)

(58) Field of Classification Search
None
See application file for complete search history.

(56) References Cited

U.S. PATENT DOCUMENTS

| | | |
|---|---|---|
| 2,760,863 A | 8/1956 | Plambeck, Jr. |
| 2,850,445 A | 9/1958 | Oster |
| 2,875,047 A | 2/1959 | Oster |
| 3,081,343 A | 3/1963 | Merten et al. |
| 3,097,096 A | 7/1963 | Oster |
| 3,427,161 A | 2/1969 | Laridon et al. |
| 3,479,185 A | 11/1969 | Chambers, Jr. |
| 3,519,605 A | 7/1970 | Takekoshi |
| 3,549,367 A | 12/1970 | Chang et al. |
| 4,180,646 A | 12/1979 | Choi et al. |
| 4,189,323 A | 2/1980 | Buhr |
| 4,343,885 A | 8/1982 | Reardon, Jr. |
| 4,442,197 A | 4/1984 | Crivello et al. |
| 4,603,101 A | 7/1986 | Crivello |
| 4,624,912 A | 11/1986 | Zweifel et al. |
| 4,898,928 A | 2/1990 | Heller et al. |
| 5,204,442 A | 4/1993 | Nye |
| 5,344,742 A | 9/1994 | Sinta et al. |
| 5,512,207 A | 4/1996 | Manero et al. |
| 5,550,236 A | 8/1996 | Schlosser et al. |
| 5,597,854 A | 1/1997 | Birbaum et al. |
| 5,710,121 A | 1/1998 | Tracy et al. |
| 5,728,835 A | 3/1998 | Aoki et al. |
| 5,837,712 A | 11/1998 | Losel et al. |
| 5,847,149 A | 12/1998 | Fuss et al. |
| 5,919,930 A | 7/1999 | Haber et al. |
| 6,008,266 A | 12/1999 | Kuczynski et al. |
| 6,531,291 B1 | 3/2003 | Kabbash et al. |
| 6,670,387 B1 | 12/2003 | Luengo et al. |

(Continued)

FOREIGN PATENT DOCUMENTS

| | | |
|---|---|---|
| CN | 102584741 A | 7/2012 |
| DE | 19710614 A1 | 9/1998 |

(Continued)

OTHER PUBLICATIONS

Derwent English abstract for JP2003-66610 (2003).*

(Continued)

*Primary Examiner* — Sin Lee
(74) *Attorney, Agent, or Firm* — Cantor Colburn LLP

(57) ABSTRACT

A photoresist composition includes a polymer with repeat units having the structure

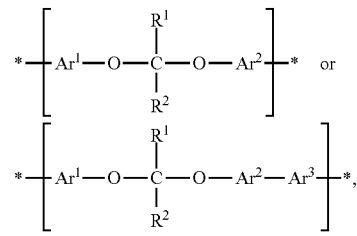

wherein each occurrence of $R^1$ and $R^2$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl; and $R^1$ and $R^2$ are optionally covalently linked to each other to form a ring that includes —$R^1$—C—$R^2$—; each occurrence of $Ar^1$, $Ar^2$, and $Ar^3$ is independently an unsubstituted or substituted $C_{6-18}$ arylene, or unsubstituted or substituted $C_{3-18}$ heteroarylene. In addition to the polymer, the photoresist composition includes a photoactive component selected from photoacid generators, photobase generators, photoinitiators, and combinations thereof.

9 Claims, 5 Drawing Sheets

(56) References Cited

U.S. PATENT DOCUMENTS

| | | | |
|---|---|---|---|
| 6,867,250 | B1 | 3/2005 | Gupta et al. |
| 6,878,374 | B2 | 4/2005 | Yu et al. |
| 7,442,797 | B2 | 10/2008 | Itoh et al. |
| 7,632,630 | B2 | 12/2009 | Mori et al. |
| 7,892,344 | B2 | 2/2011 | Reipen et al. |
| 8,128,848 | B2 | 3/2012 | Reipen et al. |
| 8,431,325 | B2 | 4/2013 | Hashimoto et al. |
| 8,617,723 | B2 | 12/2013 | Stoessel |
| 2002/0099070 | A1 | 7/2002 | Agrios |
| 2005/0164119 | A1 | 7/2005 | Maeda et al. |
| 2006/0025548 | A1 | 2/2006 | Boussie et al. |
| 2006/0052554 | A1 | 3/2006 | Boussie et al. |
| 2006/0199080 | A1 | 9/2006 | Amine et al. |
| 2007/0103060 | A1 | 5/2007 | Itoh et al. |
| 2008/0033140 | A1 | 2/2008 | Alkatout et al. |
| 2009/0137681 | A1 | 5/2009 | Sinclair et al. |
| 2009/0142681 | A1 | 6/2009 | Reipen et al. |
| 2009/0209533 | A1 | 8/2009 | Zablocki et al. |
| 2012/0141939 | A1 | 6/2012 | Thackeray et al. |

FOREIGN PATENT DOCUMENTS

| | | | |
|---|---|---|---|
| DE | 102008032092 A1 | | 1/2010 |
| EP | 0164248 A2 | | 12/1985 |
| EP | 0182188 A2 | | 5/1986 |
| EP | 0232972 A2 | | 8/1987 |
| EP | 0474596 A1 | | 3/1992 |
| JP | 2003-66610 | * | 3/2003 |
| JP | 2006008953 A | | 1/2006 |
| JP | 2007284402 A | | 11/2007 |
| JP | 2008110944 A | | 5/2008 |
| JP | 2009209090 A | | 9/2009 |
| WO | 9641166 A2 | | 12/1996 |
| WO | 9713762 A1 | | 4/1997 |
| WO | 9952915 A1 | | 10/1999 |
| WO | 0136386 A1 | | 5/2001 |
| WO | 0142211 A2 | | 6/2001 |
| WO | 0243760 A1 | | 6/2002 |
| WO | 03091262 A1 | | 11/2003 |
| WO | 2007099392 A2 | | 9/2007 |
| WO | 2008014497 A2 | | 1/2008 |
| WO | 2008021048 A2 | | 2/2008 |
| WO | 2008033197 A2 | | 3/2008 |
| WO | 2008070733 A2 | | 6/2008 |
| WO | 2008088690 A2 | | 7/2008 |
| WO | 2009061924 A2 | | 5/2009 |
| WO | 2011116951 A1 | | 9/2011 |
| WO | 2011159633 A1 | | 12/2011 |
| WO | 2011161451 A1 | | 12/2011 |
| WO | 2012004674 A2 | | 1/2012 |
| WO | 2012004675 A2 | | 1/2012 |
| WO | 2012004676 A2 | | 1/2012 |
| WO | 2012004680 A2 | | 1/2012 |
| WO | 2012004681 A2 | | 1/2012 |
| WO | 2012004683 A2 | | 1/2012 |
| WO | 2012006230 A1 | | 1/2012 |

OTHER PUBLICATIONS

Machine-assisted English translation for JP2003-66610, provided by JPO (2003).*
Akimoto et al ("A Novel Main Chain Cleavable Photosensitive Polyimide: Polyimide Containing Acetal Structure with Photoacid Generator", Journal of Photopolymer Science and Technology, vol. 12, No. 2 (1999) p. 245-248.*
Notice of Allowance dated Nov. 20, 2014; U.S. Appl. No. 13/943,196, filed Jul. 16, 2013.
Non-Final Office Action dated Jul. 17, 2014; U.S. Appl. No. 13/943,233, filed Jul. 16, 2013.
Notice of Allowance dated Nov. 3, 2014; U.S. Appl. No. 13/943,232, filed Jul. 16, 2013.
U.S. Appl. No. 13/943,169, filed Jul. 16, 2013.
U.S. Appl. No. 13/943,196, filed Jul. 16, 2013.
U.S. Appl. No. 13/943,232, filed Jul. 16, 2013.
Urawa et al., "Investigations into the Suzuki-Miyaura coupling aiming at multikilogram synthesis of E2040 using (o-cyanophenyl)boronic esters", Journal of Organometallic Chemistry, vol. 653 (2002), pp. 269-278.
Bicerano, J. 2002, "For Tg at infinite molecular weights: Eq. 6.2, 6.3", Prediction of Polymer Properties, Third Edition, Marcel Dekker Inc.: New York, pp. 198-199.
Bicerano, J. 2002, "For Tg at other molecular weights: Eq. 6.4, 6.5, 6.8, 6.10" Prediction of Polymer Properties, Third Edition, Marcel Dekker Inc.: New York, p. 216-217.
Bicerano, J. 2002, "Solubility parameter at 298 K Eq. 5.4" Prediction of Polymer Properties, Third Edition, Marcel Dekker Inc.: New York, p. 137.
Bicerano, J. 2002, "For Tg at other molecular weights: Eq. 6.4, 6.5, 6.8, 6.10" Prediction of Polymer Properties, Third Edition, Marcel Dekker Inc.: New York, p. 212, 2 pages.
Fedors, "A Method for Estimating Both the Solubility Parameters and Molar Volumes of Liquids. Supplement", Polymer Engineering and Science, Jun. 1974, vol. 14, No. 6, p. 472.
Fedors, "A Method for Estimating Both the Solubility Parameters and Molar Volumes of Liquids", Polymer Engineering and Science, Feb. 1974, vol. 14, No. 2, pp. 147-154.
Frahn et al., "Suzuki Polycondensation: On Catalyst Derived Phosphorus Incorporation and Reproducibiilty of Molecular Weights", Tetrahedron, vol. 53, No. 45, pp. 15459-15467, 1997.
Ito, "Chemical Amplification Resists for Microlithography", Adv Polym Sci (2005) 172: 37-245.
Karakaya et al., "Full coverage of a hydroxy-substituted poly(paraphenylene) with first- and second-generation dendritic wedges having isocyanate focal points", Acta Polymer., 47, pp. 79-84 (1996).
Kozawa et al., "Impact of Nonconstant Diffusion Coefficient on Latent Image Quality in 22 nm Fabrication using Extreme Ultraviolet Lithography", Journal of Photopolymer Science and Technology, 2008, vol. 21, No. 3, pp. 421-427.
Onishi et al., "Acid Catalyzed Resist for KrF Excimer Laser Lithography", Journal of Photopolymer Science and Technology, 4(3), pp. 337-340 (1991).
Sakamoto et al., "Suzuki Polycondencation: Polyarylenes a la carte", Macromolecular Rapid Communications, 2009, vol. 30, pp. 653-687.
Scheler et al., "Synthesis and Properties of Alternating Fluorene-Based Oligomers for Sub-mm Photopatterning", Macromol. Chem. Phys. 2010, 211, pp. 2081-2089.
Schluter et al, "The Tenth Anniversary of Suzuki Polycondensation (SPC)", Journal of Polymer Science, Part A, Polymer Chemistry, 2001, vol. 39, pp. 1533-1556.
Seechurn et al., "Air-Stable Pd(R-allyl)LCl (L=Q-Phos, P(t-Bu)3, etc.) Systems for C-C/N Couplings: Insight into the Structure-Activity Relationship and Catalyst Activation Pathway", J. Org. Chem. 2011, 76, pp. 7918-7932.

* cited by examiner (a)

(b)

(c)

PHOTORESIST COMPOSITION, COATED SUBSTRATE, AND METHOD OF FORMING ELECTRONIC DEVICE

FIELD

The present invention relates to photoresist compositions comprising aromatic polyacetals and polyketals.

INTRODUCTION

Poly(methacrylate)-based and poly(hydroxystyrene)-based chemically amplified photoresists have reached a performance limit that is defined by a trade-off triangle of resolution, line width roughness, and sensitivity (RLS tradeoff). There is empirical evidence that attempts to improve one of the key properties (for example sensitivity) by varying the formulation degrades one or both of the remaining properties of the triangle (for example, line edge roughness and resolution). This effect limits the achievable feature size in high resolution photolithography—including photolithography using extreme ultraviolet (EUV) and electron beam irradiation sources.

One way to break out of the RLS tradeoff associated with poly(methacrylate)-based and poly(hydroxystyrene)-based chemically amplified photoresists would be to provide a polymer that undergoes chain scission of the polymeric backbone on exposure with incident radiation and post-exposure bake.

SUMMARY

One embodiment is a photoresist composition comprising: a polymer comprising a plurality of repeat units having the structure

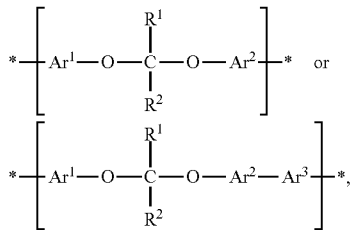

wherein each occurrence of $R^1$ and $R^2$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl; and $R^1$ and $R^2$ are optionally covalently linked to each other to form a ring that includes $—R^1—C—R^2—$; each occurrence of $Ar^1$, $Ar^2$, and $Ar^3$ is independently an unsubstituted or substituted $C_{6-18}$ arylene, or unsubstituted or substituted $C_{3-18}$ heteroarylene; and a photoactive component selected from photoacid generators, photobase generators, photoinitiators, and combinations thereof.

Another embodiment is a coated substrate, comprising: (a) a substrate having one or more layers to be patterned on a surface thereof; and (b) a layer of the photoresist composition over the one or more layers to be patterned.

Another embodiment is a method of forming an electronic device, comprising: (a) applying a layer of the photoresist composition on a substrate; (b) patternwise exposing the photoresist composition layer to activating radiation; (c) developing the exposed photoresist composition layer to provide a resist relief image, and (d) etching the resist relief pattern into the underlying substrate.

These and other embodiments are described in detailed below.

DETAILED DESCRIPTION

Figure 1:
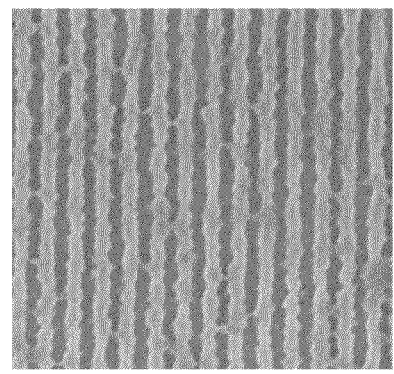
FIG. 1 presents line space images for (a) photoresist 15 at 24 nanometer Critical Dimension (CD), $E_{size}$=13.4 mJ/cm$^2$, line width roughness (LWR)=8.1 nanometers; (b) photoresist 16 at 22 nanometer CD, $E_{size}$=26.4 mJ/cm$^2$, line width roughness (LWR)=5.7 nanometers; and (c) photoresist 14 at 22 nanometer CD, $E_{size}$=19.6 mJ/cm$^2$, line width roughness (LWR)=8.6 nanometers.
Figure 1:
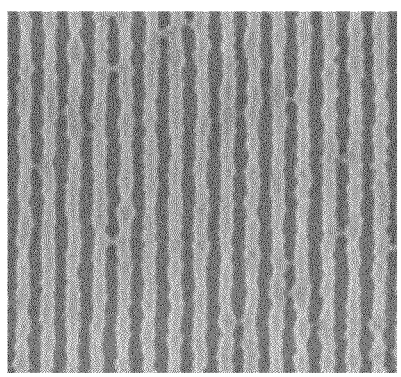
Figure 1:
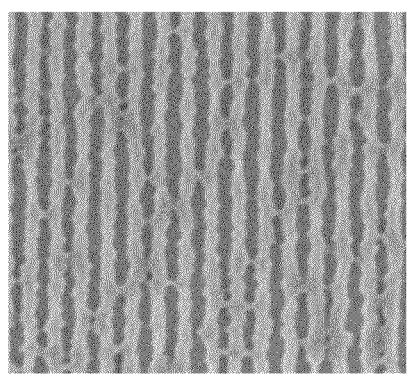
Figure 2:
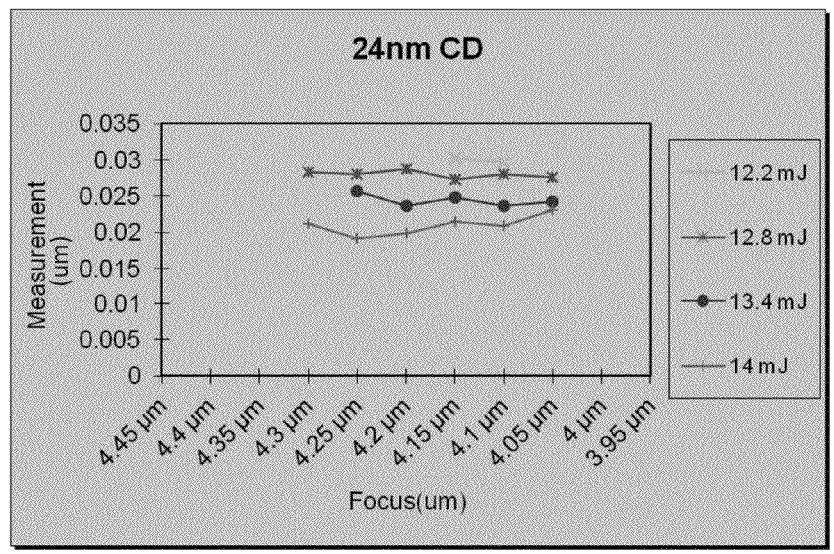
FIG. 2 is a plot of Critical Dimension (CD, in micrometers) on the y-axis versus focus (in micrometers) on the x-axis as a function of dose (expressed in millijoules per centimeter$^2$) for photoresist 15 and printing 24 nanometer features.
Figure 3:
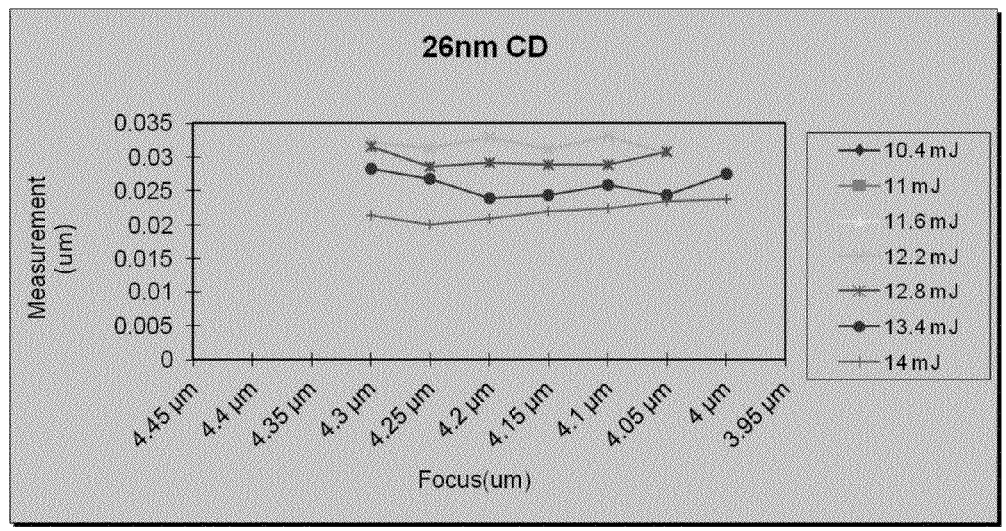
FIG. 3 is a plot of CD (in micrometers) on the y-axis versus focus (in micrometers) on the x-axis as a function of dose (expressed in millijoules per centimeter$^2$) for photoresist 15 and printing 26 nanometer features.
Figure 4:
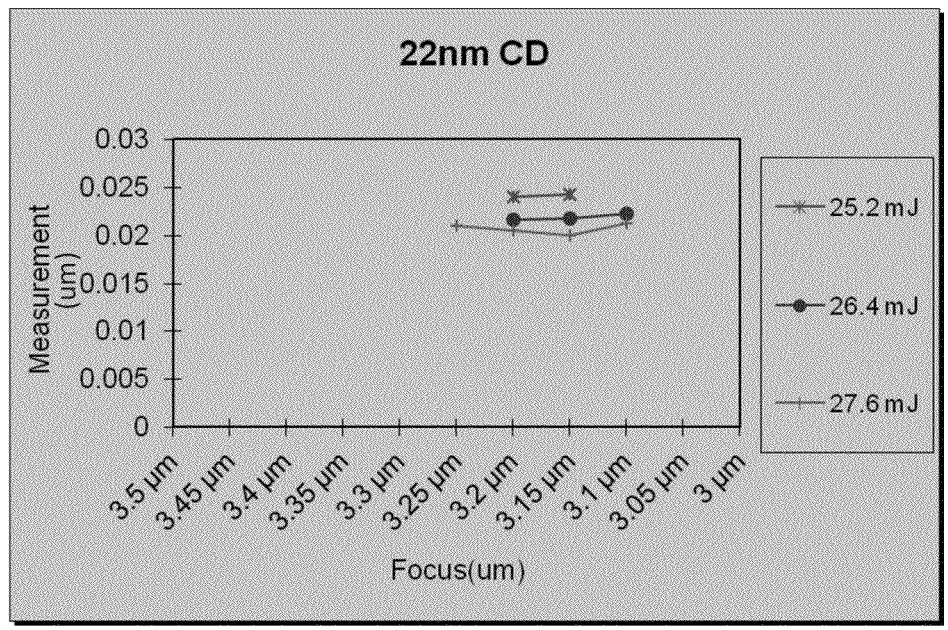
FIG. 4 is a plot of CD (in micrometers) on the y-axis versus focus (in micrometers) on the x-axis as a function of dose (expressed in millijoules per centimeter$^2$) for photoresist 16 and printing 22 nanometer features.
Figure 5:
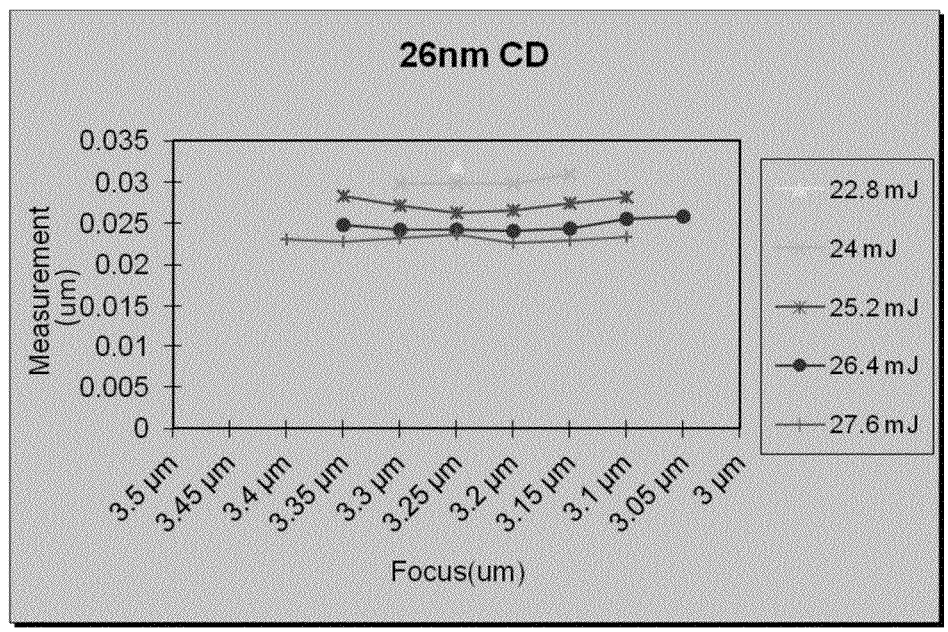
FIG. 5 is a plot of CD (in micrometers) on the y-axis versus focus (in micrometers) on the x-axis as a function of dose (expressed in millijoules per centimeter$^2$) for photoresist 16 and printing 26 nanometer features.
Figure 6:
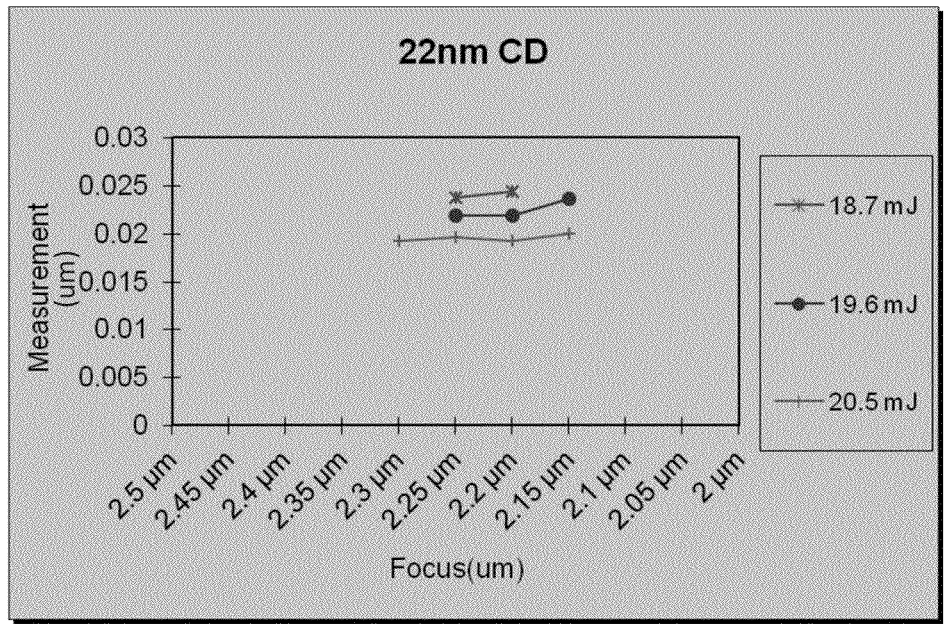
FIG. 6 is a plot of CD (in micrometers) on the y-axis versus focus (in micrometers) on the x-axis as a function of dose (expressed in millijoules per centimeter$^2$) for photoresist 14 and printing 22 nanometer features.
Figure 7:
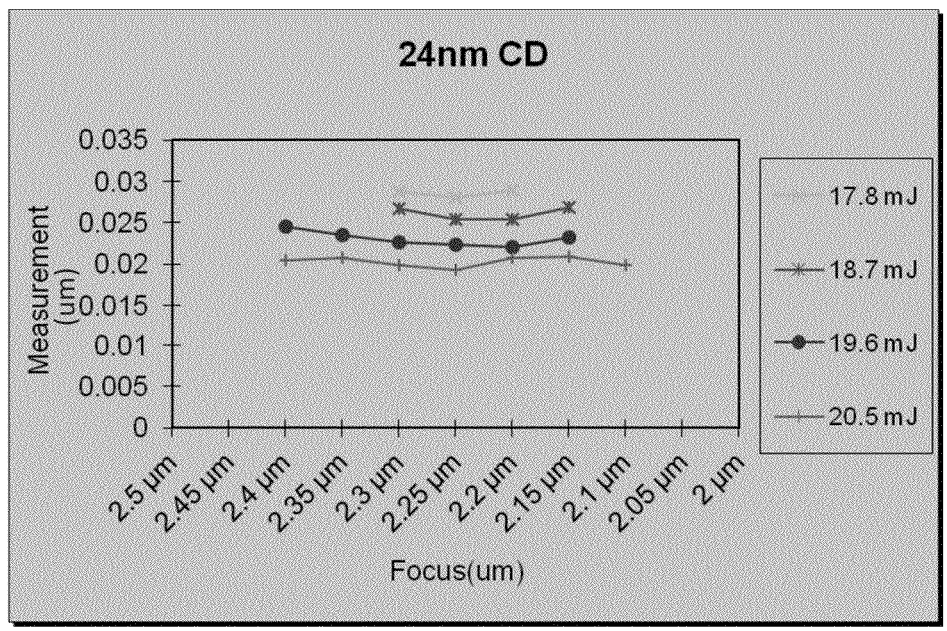
FIG. 7 is a plot of CD (in micrometers) on the y-axis versus focus (in micrometers) on the x-axis as a function of dose (expressed in millijoules per centimeter$^2$) for photoresist 14 and printing 24 nanometer features.

The present inventors have prepared aromatic polyacetal and polyketal polymers containing acid-labile acetal or ketal groups in the polymer backbone and, optionally, labile function groups pendant to the polymer. Upon exposure with incident radiation and post-exposure bake (PEB), the polymer undergoes chain scission of the polymeric backbone along with scission of any acid-labile pendant groups. When employed in photoresist compositions, the polymers provide superior resolution, line width roughness (LWR), and process window relative to methacrylate polymer-based photoresist compositions. At the same time, the polymers exhibit other properties that make them particularly useful for lithography. These properties include high glass transition temperature ($T_g$) and high ring parameter and low Ohnishi parameter (all associated with improved etch resistance), solubility in solvents common for photoresist formulations, polymer backbone heat stability, and solubility in aqueous basic developer after deprotection and depolymerization.

This application describes photoresist compositions comprising the polymers. The polymers themselves are described in co-filed U.S. application Ser. No. 13/943,169. Co-filed U.S. application Ser. No. 13/943,232 describes monomers from which the polymers are prepared. Co-filed U.S. application Ser. No. 13/943,196 describes a method of preparing the polymers.

As used herein, for brevity and except as otherwise noted, the term "acetal" shall be understood to be generic to "acetal" and "ketal", the term "oligoacetal" shall be understood to be generic to "oligoacetal" and "oligoketal", and the term "polyacetal" shall be understood to be generic to "polyacetal" and "polyketal". As used herein, the term "plurality" means at least three. Also, the term "polymer" will be understood to encompass oligomers comprising as few as three repeat units. The desired number of repeat units will depend on the intended use of the polymer. For example, when the polymer is used in a photoresist composition, it may be desirable for the polymer to comprise at least 5 repeat units, specifically 5 to 200 repeat units. As used herein, "substituted" means including at least one substituent such as a halogen (i.e., F, Cl, Br, I), hydroxyl, amino, thiol, carboxyl, carboxylate, amide, nitrile, sulfide, disulfide, nitro, $C_{1-18}$ alkyl, $C_{1-18}$ alkoxyl, $C_{6-18}$ aryl, $C_{6-18}$ aryloxyl, $C_{7-18}$ alkylaryl, or $C_{7-18}$ alkylaryloxyl. It will be understood that any group or structure disclosed with respect to the formulas herein may be so substituted unless otherwise specified. Also, "fluorinated" means having one or more fluorine atoms incorporated into the group. For example, where a $C_{1-18}$ fluoroalkyl group is indicated, the fluoroalkyl group can include one or more fluorine atoms, for example, a single fluorine atom, two fluorine atoms (e.g., as a 1,1-difluoroethyl group), three fluorine atoms (e.g., as a 2,2,2-trifluoroethyl group), or fluorine atoms at each free valence of carbon (e.g., as a perfluorinated group such as —$CF_3$, —$C_2F_5$, —$C_3F_7$, or —$C_4F_9$).

One embodiment is a photoresist composition comprising: a polymer comprising a plurality of repeat units having the structure

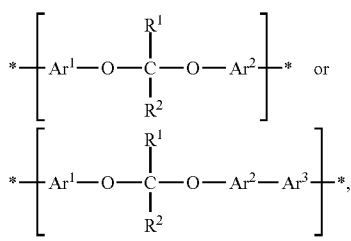

wherein each occurrence of $R^1$ and $R^2$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl; and $R^1$ and $R^2$ are optionally covalently linked to each other to form a ring that includes —$R^1$—C—$R^2$—; each occurrence of $Ar^1$, $Ar^2$, and $Ar^3$ is independently an unsubstituted or substituted $C_{6-18}$ arylene, or unsubstituted or substituted $C_{3-18}$ heteroarylene; and a photoactive component selected from photoacid generators, photobase generators, photoinitiators, and combinations thereof.

When the polymer comprises a plurality of repeat units having the structure

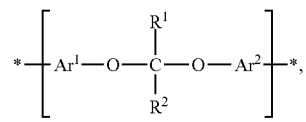

the repeat units can be formed by Suzuki polycondensation of one or more bis(aryl)acetal compounds having the structure

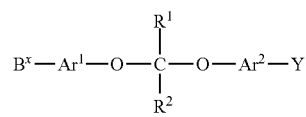

wherein $B^x$ is a boron-containing functional group bonded to $Ar^1$ via a boron atom; Y is chloro, bromo, iodo, triflate, mesylate, or tosylate; and $R^1$, $R^2$, $Ar^1$, and $Ar^2$ are defined above. Examples of $B^x$ groups include —$BF_3^-M^+$, wherein each occurrence of $M^+$ is independently an alkali metal cation, or an unsubstituted or substituted ammonium ion; —$B(OH)_2$; and

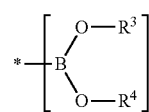

wherein $R^3$ and $R^4$ are each independently $C_{1-18}$ alkyl, $C_{3-18}$ cycloalkyl, or $C_{6-18}$ aryl; and $R^3$ and $R^4$ are optionally covalently linked to each other to form a ring that includes —$R^3$—O—B—O—$R^4$—.

There are at least two methods of forming the polymer comprising a plurality of repeat units having the structure

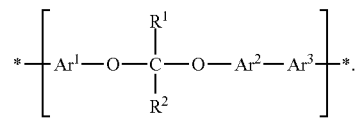

The first method comprises Suzuki polycondensation of a bis(aryl)acetal compound having the structure

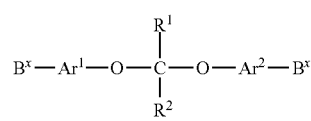

wherein $B^x$, $R^1$, $R^2$, $Ar^1$, and $Ar^2$ are defined above and each occurrence of $B^x$ is defined independently, with a bis(leaving group)arylene having the structure

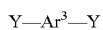

wherein Y and $Ar^3$ are defined above, and each occurrence of Y is defined independently.

The second method comprises Suzuki polycondensation of a bis(aryl)acetal compound having the structure

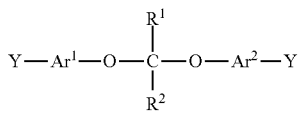

wherein Y, $R^1$, $R^2$, $Ar^1$, and $Ar^2$ are defined above and each occurrence of Y is defined independently, with a bis(leaving group)arylene having the structure

wherein $B^x$ and $Ar^3$ are defined above and each occurrence of $B^x$ is defined independently.

Reviews of Suzuki polycondensation and resulting polymers have been published by Schluter et al. in *Macromol. Rapid Commun.* 2009, 30, 653 and *J. Polym. Sci. Part A. Polym. Chem.* 2001, 39, 1533. The present inventors have determined that particularly active catalysts for polymerization include those having the structure

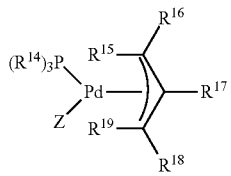

wherein each occurrence of $R^{14}$ is independently unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted ferrocenyl; $R^{15}$, $R^{16}$, $R^{17}$, $R^{18}$, $R^{19}$ are, independently, hydrogen, $C_{1-6}$ linear or branched alkyl, $C_{3-6}$ cycloalkyl, or phenyl; and Z is selected from the group consisting of fluorine, chlorine, bromine, iodine, cyano (—CN), cyanate (—OCN), isocyanate (—NCO), thiocyanate (—SCN), isothiocyanate (—NCS), nitro (—NO$_2$), nitrite (—ON=O), azide (—N=N$^+$=N$^-$), and hydroxyl. Methods of preparing such catalysts are described in C. C. C. Johansson Seechurn, S. L. Parisel, and T. J. Calacot, *J. Org. Chem.* 2011, 76, 7918-7932.

One advantage of the present polymers is that the Suzuki polycondensation used in their preparation tolerates functional groups that would be incompatible with a polyacetal synthesis in which the acetal-containing backbone is formed in the last step. Specifically, in the present polymer, at least one occurrence of $R^1$, $R^2$, $Ar^1$, $Ar^2$, or $Ar^3$ (when present) can be substituted with at least one functional group such as hydroxyl, acetal, ketal, ester, or lactone.

In some embodiments, in at least one of the repeat units of the polymer, at least one of $R^1$, $R^2$, $Ar^1$, $Ar^2$ and $Ar^3$ (when present) is substituted with hydroxyl. In some embodiments, at least 10 mole percent of repeat units in the polymer comprise at least one hydroxyl. Within the limit, the mole percent of repeat units in the polymer comprising at least one hydroxyl can be up to 40, 60, 80, 90, or 95. In some embodiments, at least one of $R^1$, $R^2$, $Ar^1$, $Ar^2$, and $Ar^3$ (when present) is substituted with hydroxyl in at least 40 mole percent of the plurality of repeat units. In some embodiments, in 40 to 99 mole percent of the plurality of repeat units at least one of $Ar^1$, $Ar^2$, and $Ar^3$ (when present) is substituted with hydroxyl, and in 1 to 60 mole percent of the plurality of repeat units at least one of $Ar^1$, $Ar^2$ and $Ar^3$ is substituted with the acetal or ketal. A preferred acetal is —O—C(H)($R^5$)—$OR^6$, wherein $R^5$ is methyl and $R^6$ is cyclohexyl. In some embodiments, each occurrence of $Ar^1$, $Ar^2$, and $Ar^3$ is independently 1,3-phenylene or 1,4-phenylene.

The acetals can be monovalent acetals having the structure

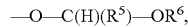

wherein $R^5$ and $R^6$ are independently selected from the group consisting of unsubstituted or substituted $C_{1-18}$ linear or branched alkyl, unsubstituted or substituted $C_{3-18}$ cycloalkyl, unsubstituted or substituted $C_{6-18}$ aryl, and unsubstituted or substituted $C_{3-18}$ heteroaryl; optionally $R^5$ or $R^6$ is covalently connected to the polymer backbone (e.g., via bonding to $R^1$ or $R^2$, or to one of $Ar^1$, $Ar^2$, and $Ar^3$ to which the oxygen end of the acetal is not already bound). In these embodiments, the acetal is part of a ring structure. The ring structure can include or not include

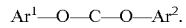

In some embodiments, $R^5$ and $R^6$ are covalently connected to each others to form a ring structure. Specific examples of monovalent acetals having the structure —O—C(H)($R^5$)—$OR^6$ include

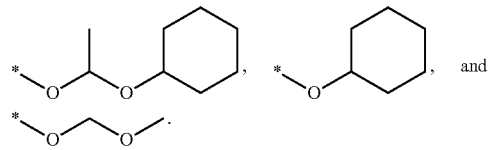

The acetals can also be divalent cyclic acetals attached via oxygen atoms to $Ar^1$, $Ar^2$, or $Ar^3$ as shown in the structure

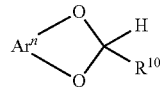

wherein $Ar^n$ is $Ar^1$, $Ar^2$, or $Ar^3$ (when present), or a combination of $Ar^1$ and $Ar^2$ (for example, when one acetal oxygen is bonded directly to $Ar^1$ and the other directly to $Ar^2$) or a combination of $Ar^2$ and $Ar^3$; $R^{10}$ is selected from the group consisting of unsubstituted or substituted $C_{1-18}$ linear or branched alkyl, unsubstituted or substituted $C_{3-18}$ cycloalkyl, unsubstituted or substituted $C_{6-18}$ aryl, and unsubstituted or substituted $C_{3-18}$ heteroaryl. In some embodiments, the cyclic acetal is part of a ring structure that includes

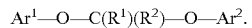

In other embodiments, the cyclic acetal is not part of such a ring structure.

The ketals can be monovalent ketals having the structure

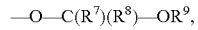

wherein $R^7$, $R^8$, and $R^9$ are independently selected from the group consisting of unsubstituted or substituted $C_{1-18}$ linear or branched alkyl, unsubstituted or substituted $C_{3-18}$ cycloalkyl, unsubstituted or substituted $C_{6-18}$ aryl, and unsubstituted or substituted $C_{3-18}$ heteroaryl. Optionally $R^7$, $R^8$, or $R^9$ is covalently connected to the polymer backbone such that the ketal is part of a ring structure.

The ketals can also be cyclic ketals attached via oxygen atoms to $Ar^1$ or $Ar^2$ as shown in the structure

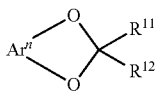

wherein Ar" is $Ar^1$ or $Ar^2$, or a combination of $Ar^1$ and $Ar^2$ (for example, when one ketal oxygen is bonded directly to $Ar^1$ and the other directly to $Ar^2$); $R^{11}$ and $R^{12}$ are independently selected from the group consisting of unsubstituted or substituted $C_{1-18}$ linear or branched alkyl, unsubstituted or substituted $C_{3-18}$ cycloalkyl, unsubstituted or substituted $C_{6-18}$ aryl, and unsubstituted or substituted $C_3$-$C_{18}$ heteroaryl. In some embodiments, the cyclic ketal is part of a ring structure that includes

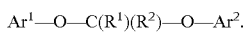

In other embodiments, the cyclic ketal is not part of such a ring structure.

The esters can have the structure

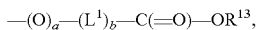

wherein a is 0 or 1 and b is 0 or 1, provided that when a is 1 then b is 1; $R^{13}$ is selected from the group consisting of unsubstituted or substituted $C_{1-20}$ linear or branched alkyl (e.g., methyl, ethyl, n-propyl, i-propyl, n-butyl, i-butyl, t-butyl, diphenylmethyl, 2-phenylpropan-2-yl, 1,1-diphenylethan-1-yl, triphenylmethyl), unsubstituted or substituted $C_{3-20}$ cycloalkyl (e.g., cyclopentyl, cyclohexyl, methylcyclohexan-1-yl, ethylcyclohexan-1-yl, 1-norbornyl, 1-adamantlyl, 2-methylbicyclo[2.2.1]heptan-2-yl, 1-adamantlyl, 2-methyladamantan-2-yl), unsubstituted or substituted $C_{6-20}$ aryl (e.g., phenyl, 1-naphthyl, and 2-naphthyl), and unsubstituted or substituted $C_{3-20}$ heteroaryl (e.g., 2-imidazolyl, 4-imidazolyl, 2-pyridyl, 3-pyridyl, and 4-pyridyl); and wherein $L^1$ is selected from the group consisting of unsubstituted or substituted $C_{1-20}$ linear or branched alkylene (e.g., methane-1,1-diyl (—$CH_2$—), ethane-1,2-diyl (—$CH_2CH_2$—), ethane-1,1-diyl (—$CH(CH_3)$—), propane-2,2-diyl (—$C(CH_3)_2$—)), unsubstituted or substituted $C_{3-20}$ cycloalkylene (e.g., 1,1-cyclopentanediyl, 1,2-cyclopentanediyl, 1,1-cyclohexanediyl, 1,4-cyclohexanediyl), unsubstituted or substituted $C_{6-20}$ arylene (e.g., 1,3-phenylene, 1,4-phenylene, 1,4-naphthylene, 1,5-naphthylene, 2,6-naphthylene), and unsubstituted or substituted $C_{3-20}$ heteroarylene (e.g., imidazo-2,4-ylene, 2,4-pyridylene, 2,5-pyridylene). In some embodiments, $R^{13}$ and $L^1$ are covalently connected to each others to form a lactone. In some embodiments, $R^{13}$ is bonded to the adjacent ester oxygen atom via a tertiary carbon atom, for example,

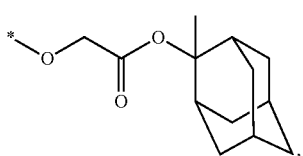

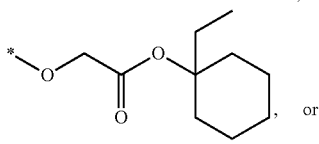

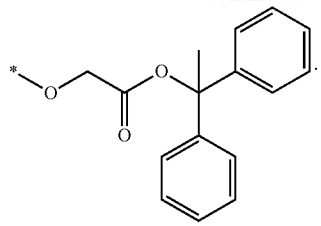

Alternatively, the esters can have the structure

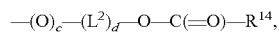

wherein c is 0 or 1 and d is 0 or 1, provided that when c is 1 then d is 1; $R^{14}$ is selected from the group consisting of unsubstituted or substituted $C_{1-20}$ linear or branched alkyl (e.g., methyl, ethyl, n-propyl, i-propyl, n-butyl, i-butyl, t-butyl, diphenylmethyl, 2-phenylpropan-2-yl, 1,1-diphenylethan-1-yl, and triphenylmethyl), unsubstituted or substituted $C_{3-20}$ cycloalkyl (e.g., cyclopentyl, cyclohexyl, 1-norbornyl, 1-adamantlyl, 2-methylbicyclo[2.2.1]heptan-2-yl, 2-methyladamantan-2-yl), unsubstituted or substituted $C_{6-20}$ aryl (e.g., phenyl, 1-naphthyl, 2-naphthyl), and unsubstituted or substituted $C_{3-20}$ heteroaryl (e.g., 2-imidazolyl, 4-imidazolyl, 2-pyridyl, 3-pyridyl, 4-pyridyl); and wherein $L^2$ is selected from the group consisting of unsubstituted or substituted $C_{1-20}$ linear or branched alkylene (e.g., methane-1,1-diyl (—$CH_2$—), ethane-1,2-diyl (—$CH_2CH_2$—), ethane-1,1-diyl (—$CH(CH_3)$—), propane-2,2-diyl (—$C(CH_3)_2$—), 2-methylpropane-1,2-diyl(—$CH_2C(CH_3)_2$—), diphenylmethylene (—$C(C6H_5)_2$—), 1-phenylmethane-1,1-diyl (—$CH(C_6H_5)$—), 2-phenylpropane-1,2-diyl (—$CH_2C(CH_3)(C_6H_5)$—), 1,1-diphenylethane-1,2-diyl(—$CH_2C(C_6H_5)_2$—)—), unsubstituted or substituted $C_{3-20}$ cycloalkylene (e.g., 1,1-cyclopentanediyl, 1,2-cyclopentanediyl, 1,1-cyclohexanediyl, 1,4-cyclohexanediyl, ethylcyclohexane-1,4-diyl, 4-methyladamantane-1,4-diyl), unsubstituted or substituted $C_{6-20}$ arylene (e.g., 1,3-phenylene, 1,4-phenylene, 1,4-naphthylene, 1,5-naphthylene, 2,6-naphthylene), and unsubstituted or substituted $C_{3-20}$ heteroarylene (e.g., imidazo-2,4-ylene, 2,4-pyridylene, 2,5-pyridylene). In some embodiments, $R^{14}$ and $L^2$ are covalently connected to each others to form a lactone. A specific example of an ester having the structure —$(O)_c$—$(L^2)_d$—O—C(=O)—$R^{14}$ is

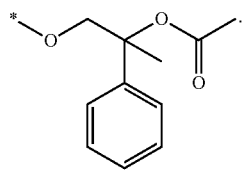 [SMILES: *OCC(C)(OC(C)=O)c1ccccc1]

The lactones can have the structure

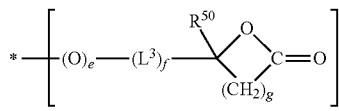

wherein e is 0 or 1; f is 0 or 1; g is 1, 2, 3, or 4 (specifically 2); $R^{50}$ is hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl; and $L^3$ is selected from the group consisting of unsubstituted or substituted $C_{1-20}$ linear or branched alkylene (e.g., unsubstituted or substituted $C_{3-20}$ cycloalkylene (e.g., 1,1-cyclopentanediyl, 1,2-cyclopentanediyl, 1,1-cyclohexanediyl, 1,4-cyclohexanediyl), unsubstituted or substituted $C_{6-20}$ arylene (e.g., 1,3-phenylene, 1,4-phenylene, 1,4-naphthylene, 1,5-naphthylene, 2,6-naphthylene), and unsubstituted or substituted $C_{3-20}$ heteroarylene (e.g., imidazo-2,4-ylene, 2,4-pyridylene, 2,5-pyridylene).

In some embodiments, in at least one of the repeat units of the polymer, at least one of $R^1$, $R^2$, $Ar^1$, $Ar^2$ and $Ar^3$ (when present) is substituted with hydroxyl. In some embodiments, at least one of $R^1$, $R^2$, $Ar^1$, $Ar^2$, and $Ar^3$ (when present) is substituted with hydroxyl in at least 40 mole percent of the plurality of repeat units. In some embodiments, in 40 to 99 mole percent of the plurality of repeat units at least one of $Ar^1$, $Ar^2$, and $Ar^3$ (when present) is substituted with hydroxyl, and in 1 to 60 mole percent of the plurality of repeat units at least one of $Ar^1$, $Ar^2$ and $Ar^3$ is substituted with the acetal or ketal. A preferred acetal is —O—C(H)($R^5$)—O$R^6$, wherein $R^5$ is methyl and $R^6$ is cyclohexyl. In some embodiments, each occurrence of $Ar^1$, $Ar^2$, and $Ar^3$ is independently 1,3-phenylene or 1,4-phenylene.

When used in applications in which the polymer is exposed to acid to promote fragmentation, it may be desirable for the polymer to exclude acid-robust linkages between the $Ar^1$ and $Ar^2$ rings. Thus, in some embodiments, $Ar^1$ and $Ar^2$ are not covalently linked with one another via an acid-robust linkage to form a ring structure that includes —$Ar^1$—O—C—O—$Ar^2$—.

Specific examples of $Ar^1$, $Ar^2$, and $Ar^3$ include unsubstituted or substituted 1,2-phenylene, unsubstituted or substituted 1,3-phenylene, unsubstituted or substituted 1,4-phenylene, unsubstituted or substituted 4,4'-biphenylene, unsubstituted or substituted 4,4"-p-terphenylene, unsubstituted or substituted 3,3"-p-terphenylene, unsubstituted or substituted 4,4"-m-terphenylene, unsubstituted or substituted 4,4"-p-terphenylene, unsubstituted or substituted 4,4"-o-terphenylene, unsubstituted or substituted 2,2"-o-terphenylene, unsubstituted or substituted 1,4-naphthylene, unsubstituted or substituted 2,7-naphthylene, unsubstituted or substituted 2,6-naphthylene, unsubstituted or substituted 1,5-naphthylene, unsubstituted or substituted 2,3-naphthylene, unsubstituted or substituted 1,7-naphthylene, unsubstituted or substituted 1,8-naphthylene, unsubstituted or substituted imidazo-2,4-ylene, 2,4-pyridylene, 2,5-pyridylene, unsubstituted or substituted 1,8-anthracenylene, unsubstituted or substituted 9,10-anthracenylene, unsubstituted or substituted 2,7-phenanthrenylene, unsubstituted or substituted 9,10-phenanthrenylene, unsubstituted or substituted 3,6-phenanthrenylene, unsubstituted or substituted 2,7-pyrenylene, unsubstituted or substituted 1,6-pyrenylene, unsubstituted or substituted 1,8-pyrenylene, unsubstituted or substituted 2,5-furanylene, unsubstituted or substituted 3,4-furanylene, unsubstituted or substituted 2,3-furanylene, unsubstituted or substituted 2,5-thiofuranylene, unsubstituted or substituted 3,4-thiofuranylene, unsubstituted or substituted 2,3-thiofuranylene, unsubstituted or substituted 2,5-oxazolylene, unsubstituted or substituted 2,7-fluorenylene, unsubstituted or substituted 2,5-benzofuranylene, unsubstituted or substituted 2,7-benzofuranylene, unsubstituted or substituted 5,7-benzofuranylene, unsubstituted or substituted 5,7-[1,3-benzoxazole], unsubstituted or substituted dithieno[3,2-b:2',3'-d]thiophene, and unsubstituted or substituted 2,7-xanthenylene. In some embodiments, each occurrence of $Ar^1$, $Ar^2$, and $Ar^3$ (when present) is independently 1,3-phenylene or 1,4-phenylene.

In the polymer repeat units, $R^1$ and $R^2$ are each independently hydrogen, unsubstituted or substituted $C_{1-18}$ linear or branched alkyl (e.g., methyl, ethyl, 1-propyl, 2-propyl, 1-butyl, 2-butyl, 1-methyl-2-propyl, diphenylmethyl, 2-phenylpropan-2-yl, 1,1-diphenylethan-1-yl, and triphenylmethyl), unsubstituted or substituted $C_{3-20}$ cycloalkyl (e.g., cyclopentyl, cyclohexyl, 1-norbornyl, 1-adamantyl, 2-methylbicyclo[2.2.1]heptan-2-yl, 2-methyladamantan-2-yl); unsubstituted or substituted $C_{6-18}$ aryl (e.g., phenyl, 1-naphthyl, 2-naphthyl, anthracenyl), or unsubstituted or substituted $C_{3-18}$ heteroaryl (e.g., 2-imidazolyl, 4-imidazolyl, 2-pyridyl, 3-pyridyl, 4-pyridyl); and $R^1$ and $R^2$ are optionally covalently linked to each other to form a ring that includes

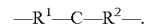

In some embodiments, at least one of $R^1$ and $R^2$ is hydrogen or methyl. In some embodiments, $R^1$ is hydrogen, and $R^2$ is selected from phenyl, hydroxyphenyl, ortho-methoxyphenyl, meta-methoxyphenyl, and para-methoxyphenyl. In some embodiments, $R^1$ is hydrogen and $R^2$ is unsubstituted or substituted phenyl. When $R^2$ is substituted phenyl, it can be substituted with a hydroxyl group, an acetal group, an ester group (including a lactone), or other such group that would be incompatible with polyacetal formation via acetal-generating polycondensation or would cause undesired polymer crosslinking. As described in a co-filed application, the present inventors have determined that such groups are tolerated in the Suzuki polycondensation reaction in which polyacetals are synthesized from the bis(aryl)acetal. Two specific examples of polymer repeat units in which $R^1$ and $R^2$ are covalently linked to each other to form a ring that includes

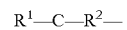

are

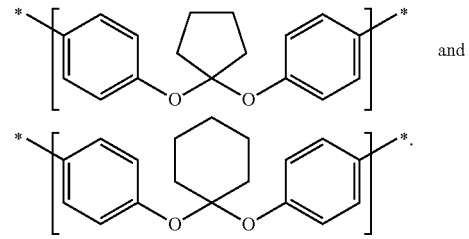

In some embodiments, at least one occurrence of $R^1$, $R^2$, $Ar^1$, $Ar^2$, or $Ar^3$ is substituted with at least one hydroxyl.

In some embodiments, at least one occurrence of $R^1$, $R^2$, $Ar^1$, $Ar^2$, or $Ar^3$ is substituted with at least one tertiary ester. The ester leaving group can be, for example, a tertiary alkyl group, a tertiary arylalkyl group, or a tertiary heteroarylalkyl group.

In some embodiments, the polymer is end-capped with terminal groups —$Ar^4$, wherein each $Ar^4$ is independently an unsubstituted or substituted $C_{6-18}$ arylene, or unsubstituted or substituted $C_{3-18}$ heteroarylene. Specific examples of $Ar^4$ include

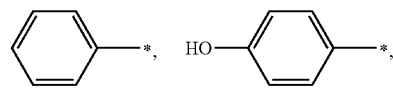

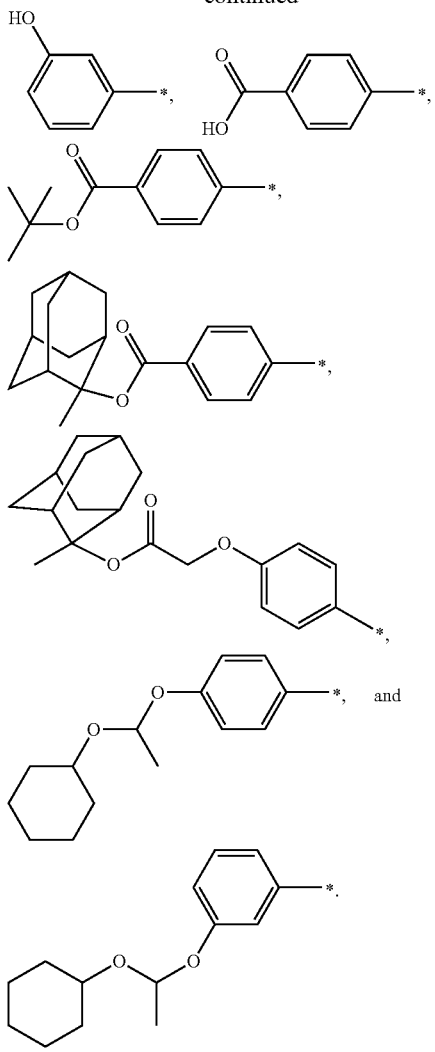

In some embodiments, at least one endcapping reagent of the form $Ar^4$—$X$ or $Ar^4$—$B^x$, wherein $X$ and $B^x$ are defined above, is added after completion of the polymerization reaction as a method to (1) reduce the halogen and/or boron content of the polymer and/or (2) to adjust polymer properties that include solubility and substrate adhesion. In some embodiments, a suitable amount of encapping reagent is 0.01 to 5 equivalents with respect to the initial monomer concentration, specifically 0.1 to 0.3 equivalents with respect to the initial monomer concentration.

In some embodiments, at least one endcapping reagent of the form $Ar^4$—$X$ or $Ar^4$—$B^x$, wherein $X$ and $B^x$ are defined above, is added at the beginning or during the course of the polymerization as a method to (1) limit molecular weight, (2) reduce the halogen and/or boron content of the final polymer and/or (3) to adjust specific polymer properties that include solubility and substrate adhesion. Suitable amounts of the end capping reagent dependent on the targeted molecular weight and/or relative reactivity of the end capping reagent in comparison with monomer reactivity and range from 0.0001 to 1 equivalent with respect to initial monomer concentration.

In some embodiments, the polymer comprises a plurality of repeat units having the structure

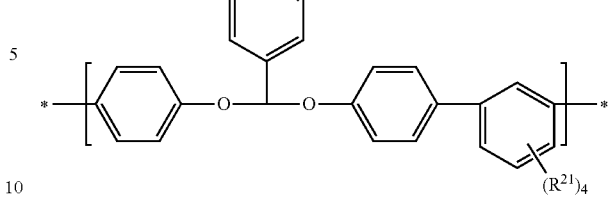

wherein one occurrence of $R^{21}$ is hydroxyl and the other three occurrence of $R^{21}$ are hydrogen; or two occurrences of $R^{21}$ are hydroxyl and the other two occurrences of $R^{21}$ are hydrogen; or three occurrences of $R^{21}$ are hydroxyl and the other occurrence of $R^{21}$ is hydrogen; or all four occurrences of $R^{21}$ are hydroxyl; or any of the foregoing occurrences of $R^{21}$ that are hydroxyl can instead be an acetal or an ester;

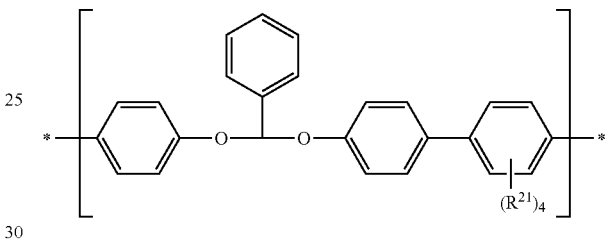

wherein one occurrence of $R^{21}$ is hydroxyl and the other three occurrence of $R^{21}$ are hydrogen; or two occurrences of $R^{21}$ are hydroxyl and the other two occurrences of $R^{21}$ are hydrogen; or three occurrences of $R^{21}$ are hydroxyl and the other occurrence of $R^{21}$ is hydrogen; or all four occurrences of $R^{21}$ are hydroxyl; or any of the foregoing occurrences of $R^{21}$ that are hydroxyl can instead be an acetal or an ester;

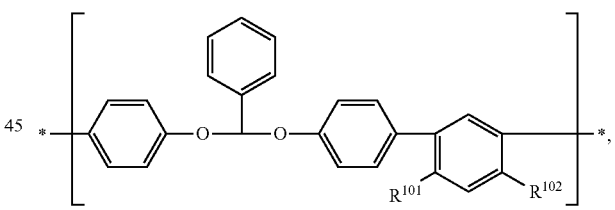

wherein $R^{101}$ is hydrogen or hydroxyl, and $R^{102}$ is hydroxyl when $R^{101}$ is hydrogen, or $R^{102}$ is hydrogen when $R^{101}$ is hydroxyl;

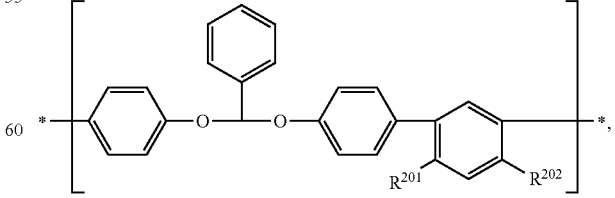

wherein $R^{201}$ is hydrogen or —OCHVE, and $R^{202}$ is —OCHVE when $R^{201}$ is hydrogen, or hydrogen when $R^{201}$ is —OCHVE, wherein —OCHVE is

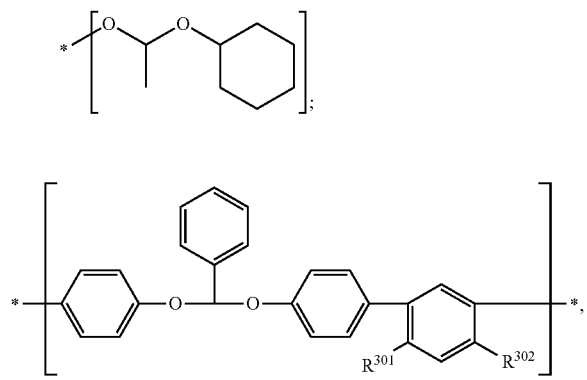

wherein R$^{301}$ is —O—C(=O)—CH$_3$ (acetate) or —OCHVE, and R$^{302}$ is —OCHVE when R$^{301}$ is —OC(=O)—CH$_3$ (acetate), or —OC(=O)—CH$_3$ (acetate) when R$^{301}$ is —OCHVE;

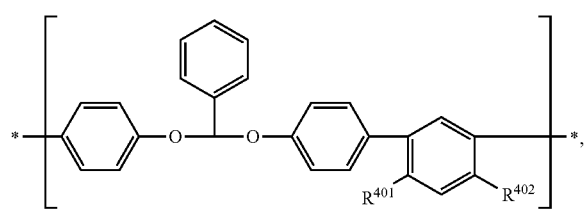

wherein R$^{401}$ and R$^{402}$ are each independently hydroxyl or —OCHVE;

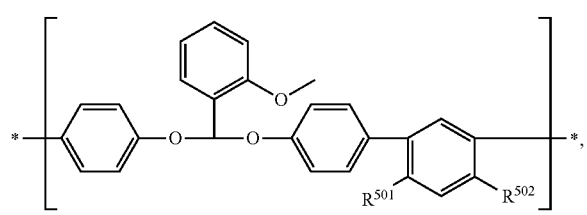

wherein R$^{501}$ is hydrogen or hydroxyl, and R$^{502}$ is hydroxyl when R$^{501}$ is hydrogen, or R$^{502}$ is hydrogen when R$^{501}$ is hydroxyl;

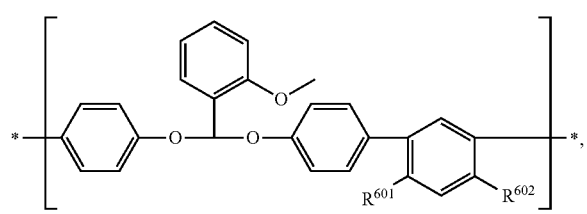

wherein R$^{601}$ is hydrogen or —OCHVE, and R$^{602}$ is —OCHVE when R$^{601}$ is hydrogen, or hydrogen when R$^{601}$ is —OCHVE;

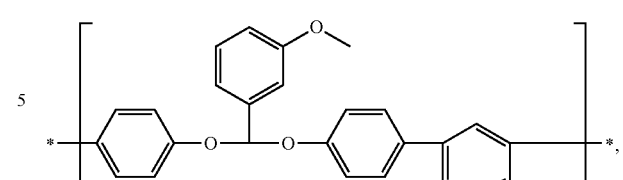

wherein R$^{701}$ is hydrogen or hydroxyl, and R$^{702}$ is hydroxyl when R$^{701}$ is hydrogen, or R$^{702}$ is hydrogen when R$^{701}$ is hydroxyl;

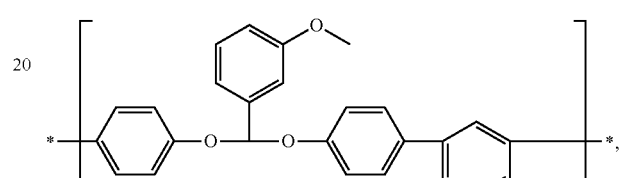

wherein R$^{801}$ is hydrogen or —OCHVE, and R$^{802}$ is —OCHVE when R$^{801}$ is hydrogen, or hydrogen when R$^{801}$ is —OCHVE;

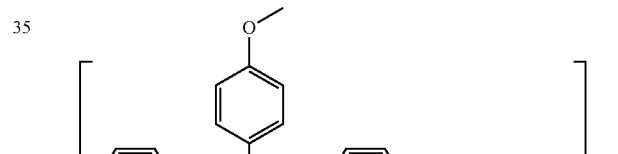

wherein R$^{901}$ is hydrogen or hydroxyl, and R$^{902}$ is hydroxyl when R$^{901}$ is hydrogen, or R$^{902}$ is hydrogen when R$^{901}$ is hydroxyl;

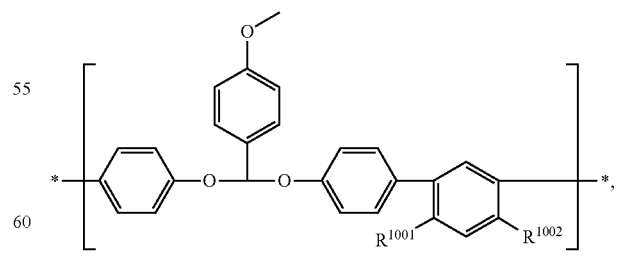

wherein R$^{1001}$ is hydrogen or —OCHVE, and R$^{1002}$ is —OCHVE when R$^{1001}$ is hydrogen, or hydrogen when R$^{1001}$ is —OCHVE;

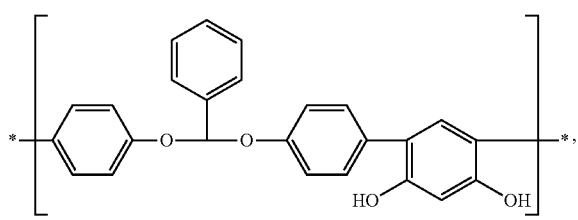

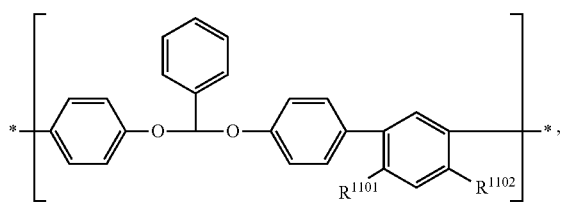

wherein $R^{1101}$ is hydrogen or —O—CH$_2$—C(=O)—O—Ad, and $R^{1102}$ is —O—CH$_2$—C(=O)—O—Ad when $R^{1101}$ is hydrogen, or hydrogen when $R^{1101}$ is —O—CH$_2$—C(=O)—O—Ad, wherein —O—CH$_2$—C(=O)—O—Ad is

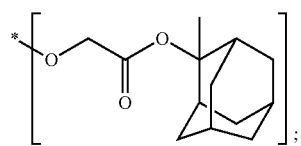

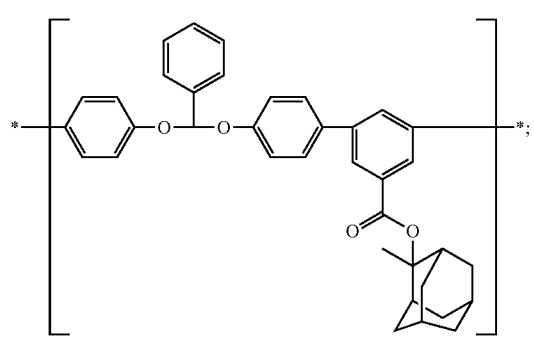

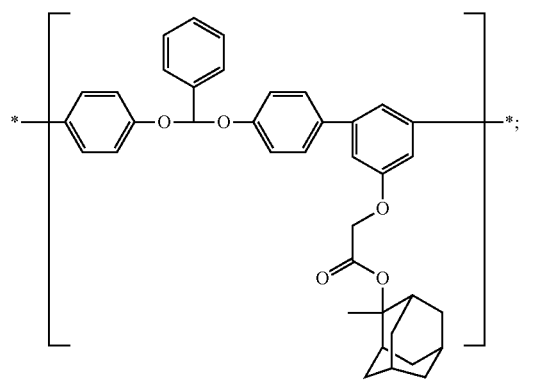

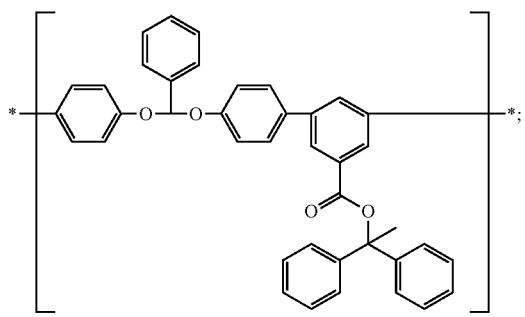

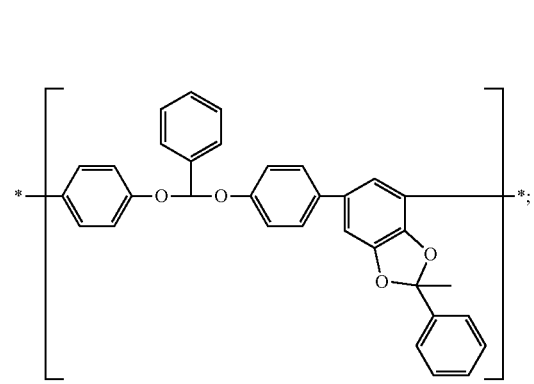

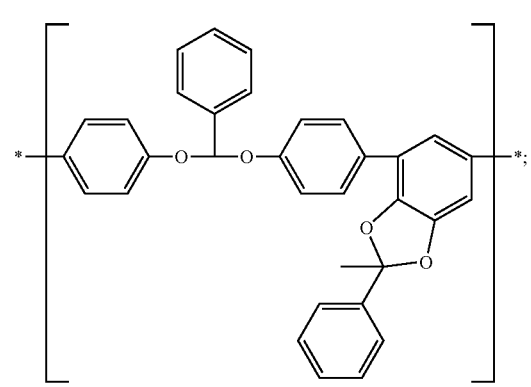

and combinations thereof

Specific examples of polymers include a polymer comprising repeat units aving the structure wherein $R^{101}$ is hydrogen or hydroxyl, and $R^{102}$ is hydroxyl when $R^{101}$ is hydrogen, or $R^{102}$ is hydrogen when $R^{101}$ is hydroxyl; a polymer comprising repeat units having the structure

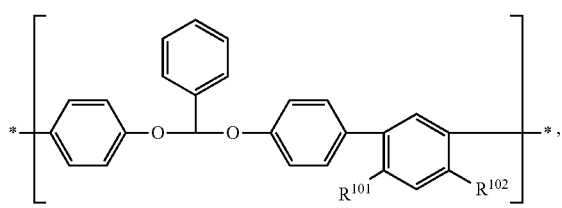

wherein $R^{101}$ is hydrogen or hydroxyl, and $R^{102}$ is hydroxyl when $R^{101}$ is hydrogen, or $R^{102}$ is hydrogen when $R^{101}$ is hydroxyl (preferably in an amount of 40 to 99 mole percent of total repeat units), and repeat units having the structure

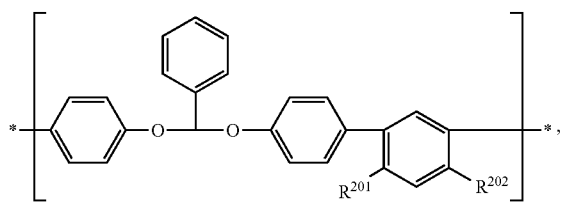

wherein $R^{201}$ is hydrogen or —OCHVE, and $R^{202}$ is —OCHVE when $R^{201}$ is hydrogen, or hydrogen when $R^{201}$ is —OCHVE, wherein —OCHVE is

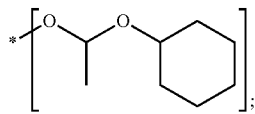

(preferably in an amount of 1 to 60 mole percent of total repeat units); a polymer comprising repeat units having the structure

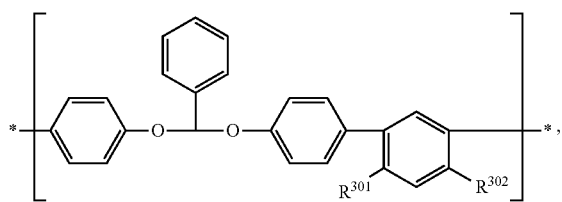

wherein $R^{301}$ is —O—C(=O)—CH$_3$ (acetate) or —OCHVE, and $R^{302}$ is —OCHVE when $R^{301}$ is —OC(=O)—CH$_3$ (acetate), or —OC(=O)—CH$_3$ (acetate) when $R^{301}$ is —OCHVE; a polymer comprising repeat units having the structure

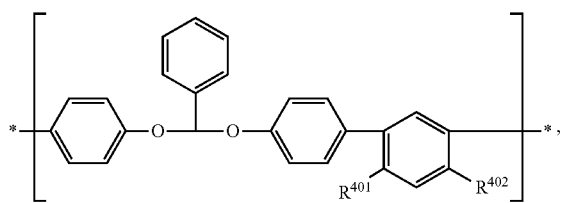

wherein $R^{401}$ and $R^{402}$ are each independently hydroxyl or —OCHVE (preferably such that about 1 to about 60 mole percent of the total moles of $R^{401}$ and $R^{402}$ are —OCHVE, and 40 to 99 mole percent of the total moles of $R^{401}$ and $R^{402}$ are hydroxyl); a polymer comprising repeat units having the structure

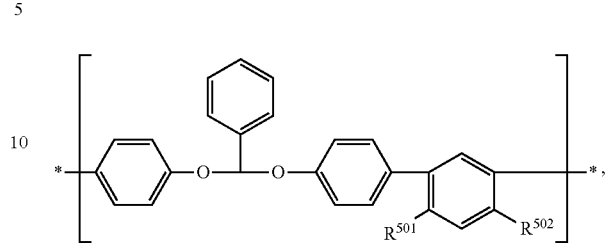

wherein $R^{501}$ is hydrogen or hydroxyl, and $R^{502}$ is hydroxyl when $R^{501}$ is hydrogen, or $R^{502}$ is hydrogen when $R^{501}$ is hydroxyl (preferably in an amount of 40 to 99 mole percent of total repeat units), and repeat units having the structure

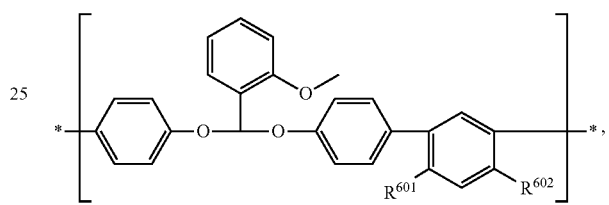

wherein $R^{601}$ is hydrogen or —OCHVE, and $R^{602}$ is —OCHVE when $R^{601}$ is hydrogen, or hydrogen when $R^{601}$ is —OCHVE (preferably in an amount of 1 to 60 mole percent of total repeat units); a polymer comprising repeat units having the structure

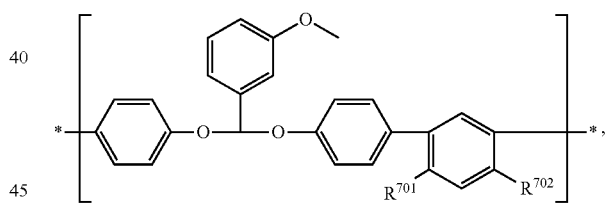

wherein $R^{701}$ is hydrogen or hydroxyl, and $R^{702}$ is hydroxyl when $R^{701}$ is hydrogen, or $R^{702}$ is hydrogen when $R^{701}$ is hydroxyl (preferably in an amount of 40 to 99 mole percent of total repeat units), and repeat units having the structure

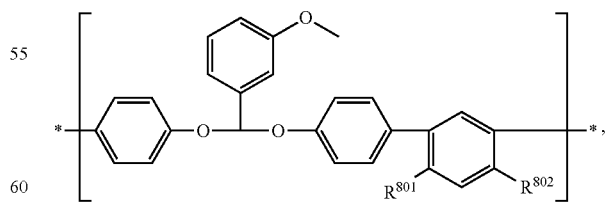

wherein $R^{801}$ is hydrogen or —OCHVE, and $R^{802}$ is —OCHVE when $R^{801}$ is hydrogen, or hydrogen when $R^{801}$ is —OCHVE (preferably in an amount of 1 to 60 mole percent of total repeat units); a polymer comprising repeat units having the structure

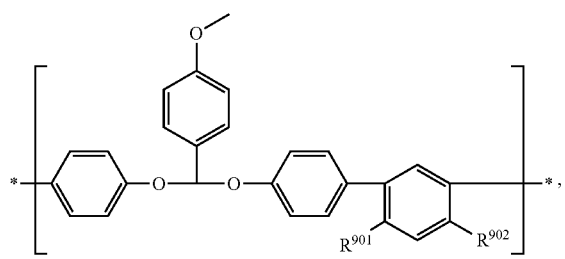

wherein $R^{901}$ is hydrogen or hydroxyl, and $R^{902}$ is hydroxyl when $R^{901}$ is hydrogen, or $R^{902}$ is hydrogen when $R^{901}$ is hydroxyl (preferably in an amount of 40 to 99 mole percent of total repeat units), and repeat units having the structure

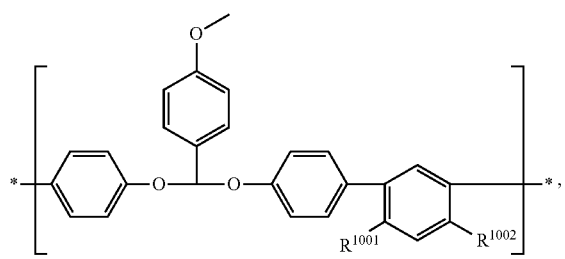

wherein $R^{1001}$ is hydrogen or —OCHVE, and $R^{1002}$ is —OCHVE when $R^{1001}$ is hydrogen, or hydrogen when $R^{1001}$ is —OCHVE (preferably in an amount of 1 to 60 mole percent of total repeat units); a polymer comprising repeat units having the structure

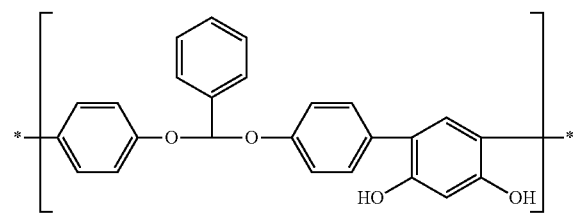

and repeat units having the structure

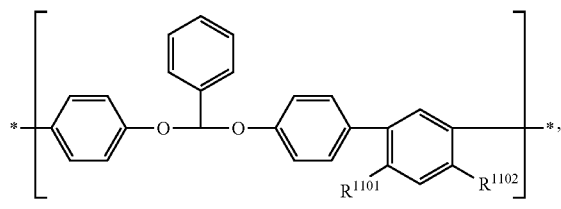

wherein $R^{1101}$ is hydrogen or —O—CH$_2$—C(=O)—O—Ad, and $R^{1102}$ is —O—CH$_2$—C(=O)—O—Ad when $R^{1101}$ is hydrogen, or hydrogen when $R^{1101}$ is —O—CH$_2$—C(=O)—O—Ad, wherein —CH$_2$—C(=O)—O—Ad is

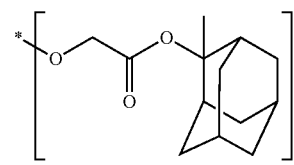

(wherein the adamantyl group is bound via the methyl-substituted 2-position); a polymer comprising repeat units having the structure

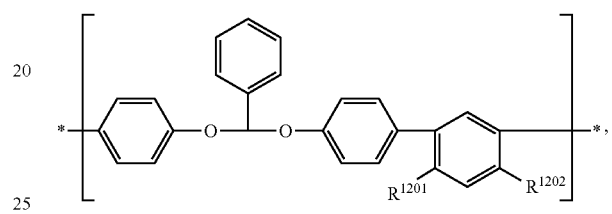

wherein $R^{1201}$ is hydrogen or hydroxyl, and $R^{1202}$ is hydroxyl when $R^{1201}$ is hydrogen, or $R^{1202}$ is hydrogen when $R^{1201}$ is hydroxyl and repeat units having the structure

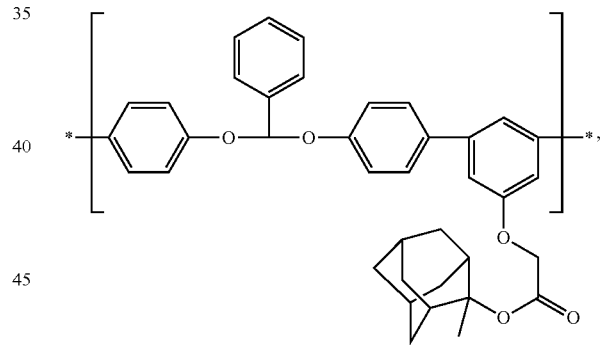

(wherein the adamantyl group is bound via the methyl-substituted 2-position); a polymer comprising repeat units having the structure

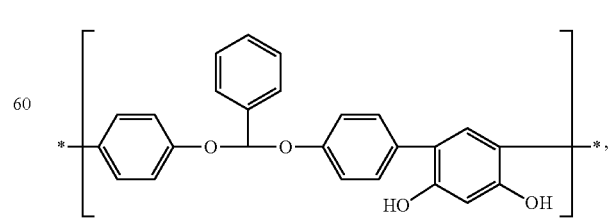

and repeat units having the structure

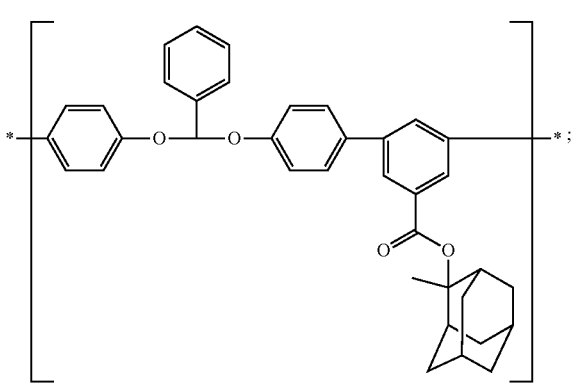

a polymer comprising repeat units having the structure

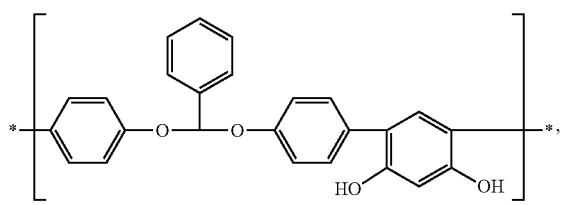

and repeat units having the structure

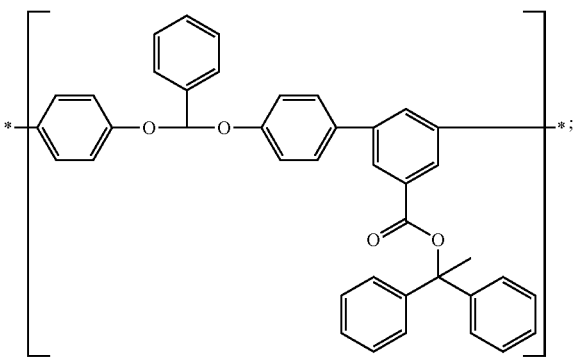

and a polymer comprising repeat units having the structure

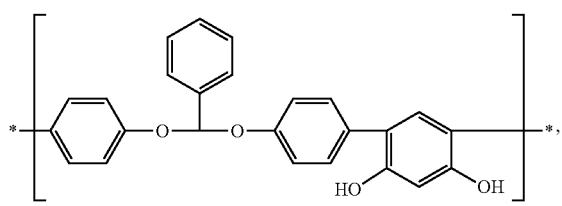

and repeat units having the structure

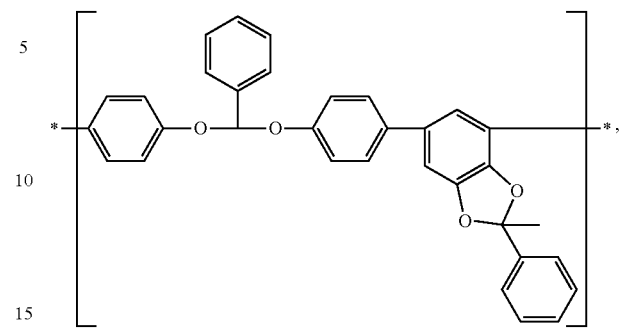

and repeat units having the structure

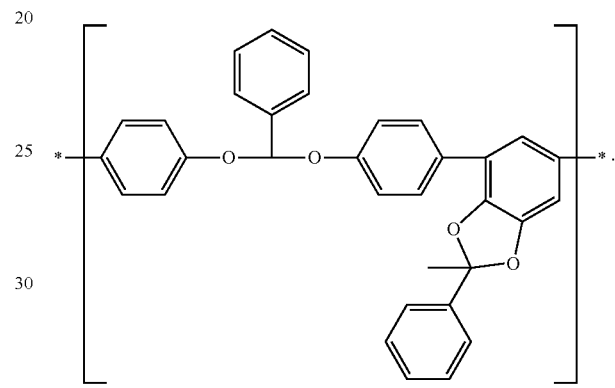

In a very specific embodiment, the polymer comprises a plurality of repeat units having the structure

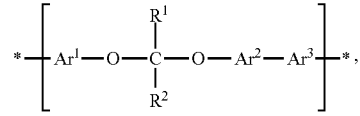

wherein each occurrence of $Ar^1$ and $Ar^2$ is 1,4-phenylene; each occurrence of $Ar^3$ is hydroxyl-substituted 1,3-phenylene; each occurrence of $R^1$ is hydrogen; and each occurrence of $R^2$ is phenyl, hydroxyphenyl, ortho-methoxyphenyl, meta-methoxyphenyl, or para-methoxyphenyl.

The polymer can be utilized in a photoresist composition that can further include a photoactive component selected from photoacid generators, photobase generators, photoinitiators, (meth)acrylate-based polymers with bound photoacid generators, polyhydroxystyrene-based polymers, and combinations thereof.

Photoacid generators include generally those photoacid generators suitable for the purpose of preparing photoresists. Photoacid generators include, for example, non-ionic oximes and various onium ion salts. Onium ions include, for example, unsubstituted and substituted ammonium ions, unsubstituted and substituted phosphonium ions, unsubstituted and substituted arsonium ions, unsubstituted and substituted stibonium ions, unsubstituted and substituted bismuthonium ions, unsubstituted and substituted oxonium ions, unsubstituted and substituted sulfonium ions, unsubstituted and substituted selenonium ions, unsubstituted and substituted telluronium ions, unsubstituted and substituted fluoronium ions, unsubstituted and substituted chloronium ions, unsubstituted and substituted bromonium ions, unsubstituted and substituted iodonium ions, unsubstituted and substituted aminodiazonium ions (substituted hydrogen azide), unsubstituted and substituted hydrocyanonium ions (substituted hydrogen cyanide), unsubstituted and substituted diazenium ions ($RN{=}N^+R_2$), unsubstituted and substituted iminium ions ($R_2C{=}N^{3O}R_2$), quaternary ammonium ions having two double-bonded substituents ($R{=}N^+{=}R$), nitronium ion ($NO_2^+$), bis(trarylphosphine)iminium ions (($Ar_3P)_2N^+$), unsubstituted or substituted tertiary ammonium having one triple-bonded substituent ($R{\equiv}NH^+$), unsubstituted and substituted nitrilium ions ($RC{\equiv}NR^+$), unsubstituted and substituted diazonium ions ($N{\equiv}N^+R$), tertiary ammonium ions having two partially double-bonded substituents ($R{=}N^+H{=}R$), unsubstituted and substituted pyridinium ions, quaternary ammonium ions having one triple-bonded substituent and one single-bonded substituent ($R{\equiv}N^+R$), tertiary oxonium ions having one triple-bonded substituent ($R{\equiv}O^+$), nitrosonium ion ($N{\equiv}O^+$), tertiary oxonium ions having two partially double-bonded substituents ($R{=}O^+{=}R$), pyrylium ion ($C_5H_5O^+$), tertiary sulfonium ions having one triple-bonded substituent ($R{\equiv}S^+$), tertiary sulfonium ions having two partially double-bonded substituents ($R{=}S^+{=}R$), and thionitrosonium ion ($N{\equiv}S^+$). In some embodiments, the onium ion is selected from unsubstituted and substituted diaryiodonium ions, and unsubstituted and substituted triarylsulfonium ions. Examples of suitable onium salts can be found in U.S. Pat. Nos. 4,442,197 to Crivello et al., 4,603,101 to Crivello, and 4,624,912 to Zweifel et al.

Suitable acid generators are known in the art of chemically amplified photoresists and include, for example: onium salts, for example, triphenylsulfonium trifluoromethanesulfonate, (p-tert-butoxyphenyl)diphenylsulfonium trifluoromethanesulfonate, tris(p-tert-butoxyphenyl)sulfonium trifluoromethanesulfonate, triphenylsulfonium p-toluenesulfonate; nitrobenzyl derivatives, for example, 2-nitrobenzyl-p-toluenesulfonate, 2,6-dinitrobenzyl-p-toluenesulfonate, and 2,4-dinitrobenzyl-p-toluenesulfonate; sulfonic acid esters, for example, 1,2,3-tris(methanesulfonyloxy)benzene, 1,2,3-tris(trifluoromethanesulfonyloxy)benzene, and 1,2,3-tris(p-toluenesulfonyloxy)benzene; diazomethane derivatives, for example, bis(benzenesulfonyl)diazomethane, bis(p-toluenesulfonyl)diazomethane; glyoxime derivatives, for example, bis-O-(p-toluenesulfonyl)-α-dimethylglyoxime, and bis-O-(n-butanesulfonyl)-α-dimethylglyoxime; sulfonic acid ester derivatives of an N-hydroxyimide compound, for example, N-hydroxysuccinimide methanesulfonic acid ester, N-hydroxysuccinimide trifluoromethanesulfonic acid ester; and halogen-containing triazine compounds, for example, 2-(4-methoxyphenyl)-4,6-bis(trichloromethyl)-1,3,5-triazine, and 2-(4-methoxynaphthyl)-4,6-bis(trichloromethyl)-1,3,5-triazine. Suitable acid generators with specific examples are further described in U.S. Pat. No. 8,431,325 to Hashimoto et al. in column 37, lines 11-47 and columns 41-91.

Two specific PAGS are the following PAG 1 and PAG2, the preparation of which is described in U.S. Patent Application Ser. No. 61/701,588, filed Sep. 15, 2012.

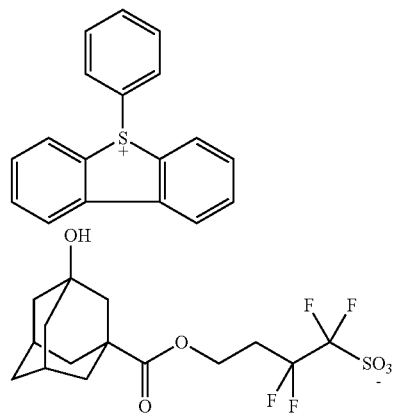

PAG1

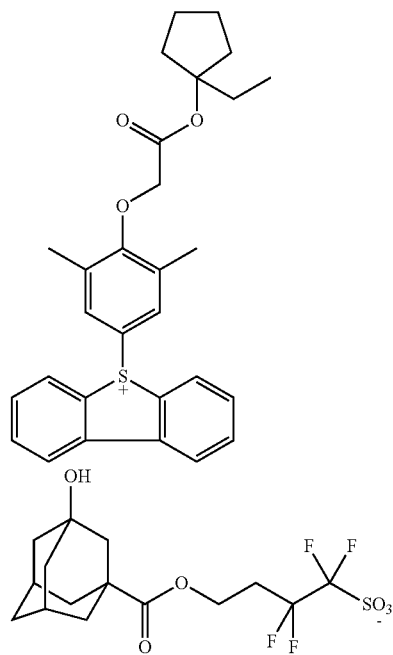

PAG2

Other suitable sulfonate PAGS including sulfonated esters and sulfonyloxy ketones. See J. of Photopolymer Science and Technology, 4(3):337-340 (1991), for disclosure of suitable sulfonate PAGS, including benzoin tosylate, t-butylphenyl α-(p-toluenesulfonyloxy)-acetate and t-butyl α-(p-toluenesulfonyloxy)-acetate. Preferred sulfonate PAGs are also disclosed in U.S. Pat. No. 5,344,742 to Sinta et al.

Other useful acid generators include the family of nitrobenzyl esters, and the s-triazine derivatives. Suitable s-triazine acid generators are disclosed, for example, in U.S. Pat. No. 4,189,323.

Halogenated non-ionic, photoacid generating compounds are also suitable such as, for example, 1,1-bis[p-chlorophenyl]-2,2,2-trichloroethane (DDT); 1,1-bis[p-methoxyphenyl]-2,2,2-trichloroetnane; 1,2,5,6,9,10-hexabromocyclodecane; 1,10-dibromodecane; 1,1-bis[p-chlorophenyl]-2,2-dichloroethane; 4,4-dichloro-2-(trichloromethyDbenzhydrol (Kelthane); hexachlorodimethyl sulfone; 2-chloro-6-(trichloromethyl)pyridine; o,o-diethyl-o-(3,5,6trichloro-2-pyridyl)phosphorothionate; 1,2,3,4,5,6-hexachlorocyclobexane; N(1,1-bis[p-chlorophenyl]-2,2,2-trichloroethyl)

acetamide; tris[2,3-dibromopropyl]isocyanurate; 2,2-bis[p-chlorophenyl]-1,1-dichloroethylene; tris[trichloromethyl]s-triazine; and their isomers, analogs, homologs, and residual compounds. Suitable photoacid generators are also disclosed in European Patent Application Nos. 0164248 and 0232972. Acid generators that are particularly preferred for deep U.V. exposure include 1,1-bis(p-chlorophenyl)-2,2,2-trichloroethane (DDT); 1,1-bis(p-methoxyphenol)-2,2,2-trichloroethane; 1,1-bis(chlorophenyl)-2,2,2 trichloroethanol; tris(1,2,3-methanesulfonyl)benzene; and tris(trichloromethyl) triazine.

Photoacid generators further include photo-destroyable bases. Photo-destroyable bases include photo-decomposable cations, and preferably those useful for preparing PAGs, paired with an anion of a weak ($pK_a$>2) acid such as, for example, a $C_{1-20}$ carboxylic acid. Exemplary such carboxylic acids include formic acid, acetic acid, propionic acid, tartaric acid, succinic acid, cyclohexylcarboxylic acid, benzoic acid, salicylic acid, and other such carboxylic acids. Exemplary photo-destroyable bases include those combining cations and anions of the following structures where the cation is triphenylsulfonium or one of the following:

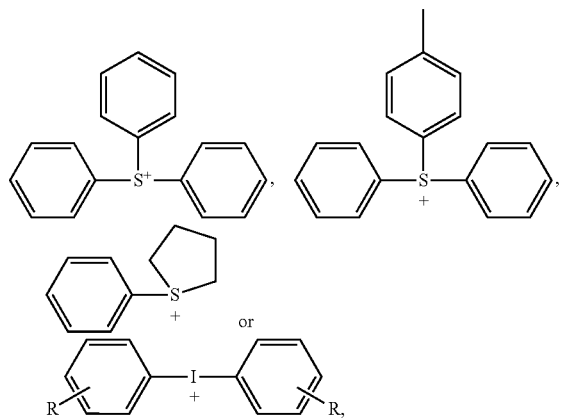

where R is independently H, a $C_{1-20}$ alkyl, a $C_{6-20}$ aryl, or a $C_{6-20}$ alkyl aryl, and the anion is

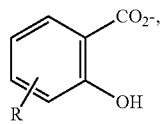

RC(=O)—O⁻, or ⁻OH, where R is independently H, a $C_{1-20}$ alkyl, a $C_{1-20}$ alkoxyl, a $C_{6-20}$ aryl, or a $C_{6-20}$ alkyl aryl.

The photoresist can include a photobase generator, including those based on non-ionic photo-decomposing chromophores such as, for example, 2-nitrobenzyl groups and benzoin groups. An exemplary photobase generator is ortho-nitrobenzyl carbamate.

The photoresist can include a photoinitiator. Photoinitiators are used in the photoresist composition for initiating polymerization of the cross-linking agents by generation of free-radicals. Suitable free radical photoinitiators include, for example, azo compounds, sulfur containing compounds, metallic salts and complexes, oximes, amines, polynuclear compounds, organic carbonyl compounds and mixtures thereof as described in U.S. Pat. No. 4,343,885, column 13, line 26 to column 17, line 18; and 9,10-anthraquinone; 1-chloroanthraquinone; 2-chloroanthraquinone; 2-methylanthraquinone; 2-ethylanthraquinone; 2-tert-butylanthraquinone; octamethylanthraquinone; 1,4-naphthoquinone; 9,10 -phenanthrenequinone; 1,2-benzanthraquinone; 2,3-benzanthraquinone; 2-methyl-1,4-naphthoquinone; 2,3-dichloronaphthoquinone; 1,4-dimethylanthraquinone; 2,3-dimethylanthraquinone; 2-phenylanthraquinone; 2,3-diphenylanthraquinone; 3-chloro-2-methylanthraquinone; retenequinone; 7,8,9,10-tetrahydronaphthalenequinone; and 1,2,3,4-tetrahydrobenz(a)anthracene-7,12-dione. Other photoinitiators are described in U.S. Pat. No. 2,760,863 and include vicinal ketaldonyl alcohols, such as benzoin, pivaloin, acyloin ethers, e.g., benzoin methyl and ethyl ethers; and alpha-hydrocarbon-substituted aromatic acyloins, including alpha-methylbenzoin, alpha-allylbenzoin, and alpha-phenylbenzoin. Photoreducible dyes and reducing agents disclosed in U.S. Pat. Nos. 2,850,445; 2,875,047; and 3,097,096 as well as dyes of the phenazine, oxazine, and quinone classes; benzophenone, 2,4,5-triphenylimidazolyl dimers with hydrogen donors, and mixtures thereof as described in U.S. Pat. Nos. 3,427,161; 3,479,185; and 3,549,367 can be also used as photoinitiators.

The photoresist composition can further include a surfactant. Illustrative surfactants include fluorinated and non-fluorinated surfactants, and are preferably non-ionic. Exemplary fluorinated non-ionic surfactants include perfluoro $C_4$ surfactants such as FC-4430 and FC-4432 surfactants, available from 3M Corporation; and fluorodiols such as POLYFOX PF-636, PF-6320, PF-656, and PF-6520 fluorosurfactants from Omnova.

The photoresist composition can further include quenchers that are non-photo-destroyable bases. These include, for example, those based on hydroxides, carboxylates, amines, imines and amides. Such quenchers include $C_{1-30}$ organic amines, imines or amides, $C_{1-30}$ quaternary ammonium salts of strong bases (e.g., a hydroxide or alkoxide) or a weak base (e.g., a carboxylate). Exemplary quenchers include amines such as Troger's base; hindered amines such as diazabicycloundecene (DBU), diazabicyclononene (DBM), and tetrahydroxy isopropyl diamine and tert-butyl-4-hydroxy-1-piperidiene carboxylate; ionic quenchers including quaternary alkyl ammonium salts such as tetrabutylammonium hydroxide (TBAH), tetramethylammonium 2-hydroxybenzoic acid (TMA OHBA), and tetrabutylammonium lactate. Suitable quenchers are further described in U.S. Pat. No. 8,431,325 to Hashimoto et al.

The photoresist components are typically dissolved in a solvent for dispensing and coating. Exemplary solvents include anisole; alcohols including 1-methoxy-2-propanol, and 1-ethoxy-2 propanol; esters including n-butyl acetate, ethyl lactate, 1-methoxy-2-propyl acetate, methoxyethoxy propionate, and ethoxyethoxy propionate; ketones including cyclohexanone and 2-heptanone; and combinations thereof. The solvent amount can be, for example, 70 to 99 weight percent, specifically 85 to 98 weight percent, based on the total weight of the photoresist composition.

In some embodiments, the photoresist composition in solution comprises the polymer in an amount of 50 to 99 weight percent, specifically 55 to 95 weight percent, more specifically 65 to 90 based on the total weight of solids. It will be understood that "polymer" used in this context of a component in a photoresist may mean only the acetal polymer disclosed herein, or a combination of the acetal polymer with another polymer useful in a photoresist. The photo-destroyable base may be present in the photoresist in an amount of 0.01 to 5 weight percent, specifically 0.1 to 4 weight percent, more specifically 0.2 to 3 weight percent, based on the total weight of solids. A surfactant may be included in an amount of 0.01 to 5 weight percent, specifically 0.1 to 4 weight percent, more specifically 0.2 to 3 weight percent, based on the total weight of solids. A photoacid generator is included in the amounts of 0 to 50 weight percent, specifically 1.5 to 45 weight percent, more specifically 2 to 40 weight percent, based on the total weight of solids. It will be understood that total solids includes polymer, photo-destroyable base, quencher, surfactant, any added PAG, and any optional additives, exclusive of solvent.

The invention includes a coated substrate, comprising: (a) a substrate having one or more layers to be patterned on a surface thereof; and (b) a layer of any of the photoresist compositions described herein over the one or more layers to be patterned.

The substrate can be of a material such as a semiconductor, such as silicon or a compound semiconductor (e.g., III-V or II-VI), glass, quartz, ceramic, copper and the like. Typically, the substrate is a semiconductor wafer, such as single crystal silicon or compound semiconductor wafer, having one or more layers and patterned features formed on a surface thereof. Optionally, the underlying base substrate material itself may be patterned, for example, when it is desired to form trenches in the base substrate material. Layers formed over the base substrate material may include, for example, one or more conductive layers such as layers of aluminum, copper, molybdenum, tantalum, titanium, tungsten, and alloys, nitrides or silicides of such metals, doped amorphous silicon or doped polysilicon, one or more dielectric layers such as layers of silicon oxide, silicon nitride, silicon oxynitride or metal oxides, semiconductor layers, such as single-crystal silicon, underlayers, antireflective layers such as a bottom antireflective layers, and combinations thereof. The layers can be formed by various techniques, for example, chemical vapor deposition (CVD) such as plasma-enhanced CVD, low-pressure CVD or epitaxial growth, physical vapor deposition (PVD) such as sputtering or evaporation, electroplating or spin-coating.

The invention further includes a method of forming an electronic device, comprising: (a) applying a layer of any of the photoresist compositions described herein on a substrate; (b) patternwise exposing the photoresist composition layer to activating radiation; (c) developing the exposed photoresist composition layer to provide a resist relief image, and (d) etching the resist relief pattern into the underlying substrate.

Applying the photoresist composition to the substrate can be accomplished by any suitable method, including spin coating, spray coating, dip coating, and doctor blading. In some embodiments, applying the layer of photoresist composition is accomplished by spin coating the photoresist in solvent using a coating track, in which the photoresist composition is dispensed on a spinning wafer. During dispensing, the wafer can be spun at a speed of up to 4,000 rotations per minute (rpm), specifically 500 to 3,000 rpm, and more specifically 1,000 to 2,500 rpm. The coated wafer is spun to remove solvent, and baked on a hot plate to remove residual solvent and free volume from the film to make it uniformly dense.

Patternwise exposure is then carried out using an exposure tool such as a stepper, in which the film is irradiated through a pattern mask and thereby is exposed patternwise. In some embodiments, the method uses advanced exposure tools generating activating radiation at wavelengths capable of high resolution including extreme-ultraviolet (EUV) or electron-beam (e-beam) radiation. It will be appreciated that exposure using the activating radiation decomposes the PAG in the exposed areas and generates acid and decomposition by-products, and that the acid then effects a chemical change in the polymer (deblocking the acid sensitive groups to generate a base-soluble group, or alternatively, catalyzing a cross-linking reaction in the exposed areas) during the post exposure bake (PEB) step. The resolution of such exposure tools can be less than 30 nanometers.

Developing the exposed photoresist layer is then accomplished by treating the exposed layer with a suitable developer capable of selectively removing the exposed portions of the film (where the photoresist is positive tone) or removing the unexposed portions of the film (where the photoresist is crosslinkable in the exposed regions, i.e., negative tone). In some embodiments, the photoresist is positive tone based on a polymer having acid-sensitive (deprotectable) groups, and the developer is preferably a metal-ion-free tetraalkylammonium hydroxide solution, such as, for example, aqueous 0.26 Normal tetramethylammonium hydroxide. Alternatively, negative tone development (NTD) can be conducted by use of a suitable organic solvent developer. NTD results in the removal of unexposed regions of the photoresist layer, leaving behind exposed regions due to polarity reversal of those regions. Suitable NTD developers include, for example, ketones, esters, ethers, hydrocarbons, and mixtures thereof. Other suitable solvents include those used in the photoresist composition. In some embodiments, the developer is 2-heptanone or a butyl acetate such as n-butyl acetate. Whether the development is positive tone or negative tone, a pattern forms by developing.

The photoresist can, when used in one or more such a pattern-forming processes, be used to fabricate electronic and optoelectronic devices such as memory devices, processor chips (including central processing units or CPUs), graphics chips, and other such devices.

The invention is further illustrated by the following examples.

EXAMPLES

The following polymers were used in lithographic testing (the subscript for each structural unit represents the mole fraction of that unit in the polymer).

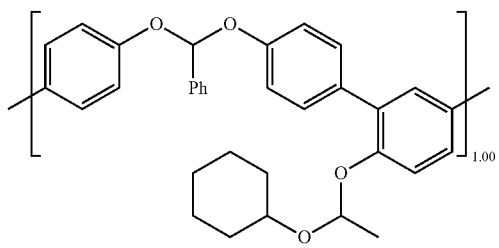

pBEBA-2,4-DBP-CHVE (100%)

-continued

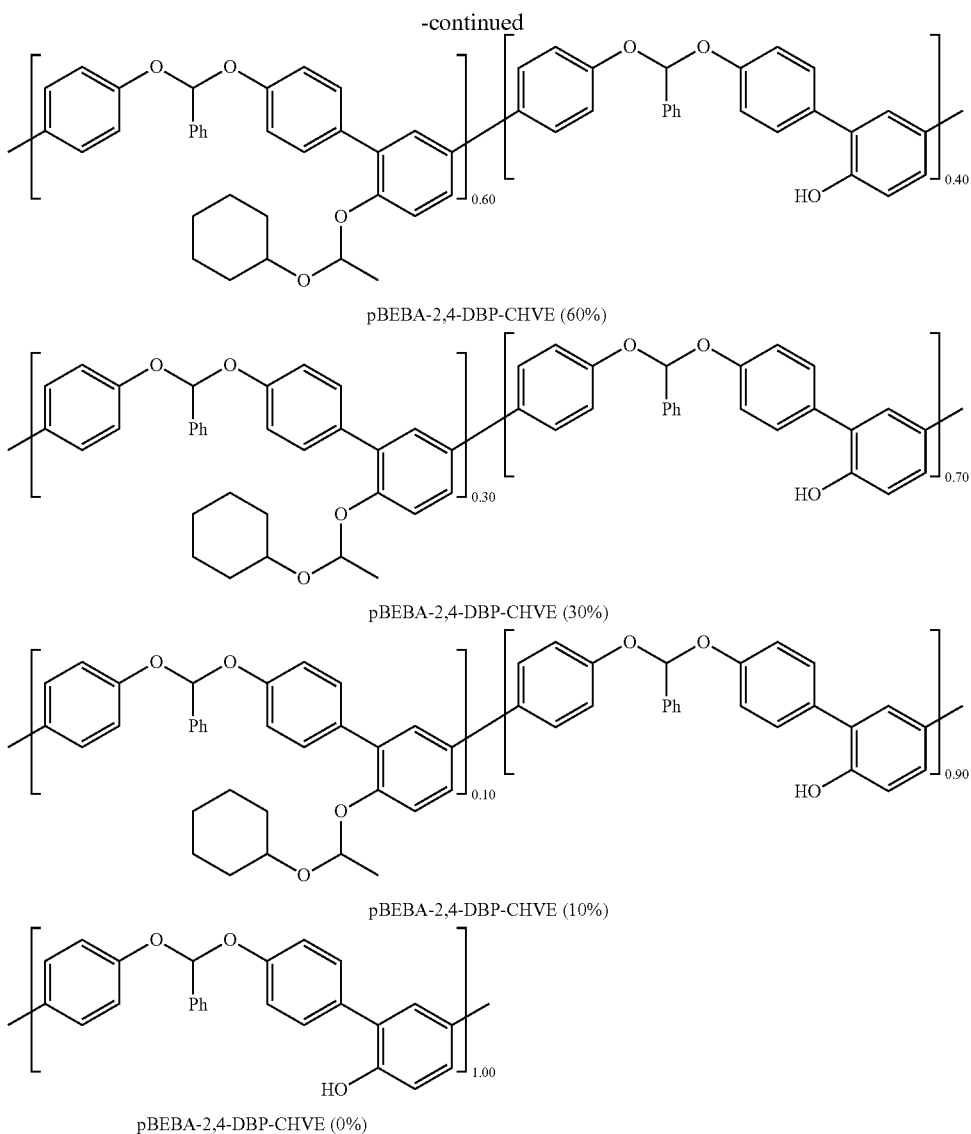

pBEBA-2,4-DBP-CHVE (60%)

pBEBA-2,4-DBP-CHVE (30%)

pBEBA-2,4-DBP-CHVE (10%)

pBEBA-2,4-DBP-CHVE (0%)

Synthesis and characterization of these polymers is described in co-filed U.S. patent application Ser. No. 13/943,169.

Lithographic evaluation of photoresist compositions utilized three test procedures: (1) strip test, (2) contrast curve and $E_o$ measurement, and (3) lithographic processing.

In the strip test, the formulated sample is spin coated on a 200 millimeter hexamethyldisilazane (HMDS) primed silicon wafer using a TEL ACT-8 (Tokyo Electron) track at 1500 rotations per minute (rpm) to yield a 60 nanometer thick resist film. The coated resist is then soft baked at 90° C. for 60 seconds. The strip test is performed with 0.26 N tetramethylammonium hydroxide (TMAH) for 60 seconds followed by a deionized water rinse. The films are then baked at 110° C. for 60 seconds. The loss in film thickness after developing is noted in Table 1 below.

For contrast curve and $E_o$ measurement, the formulated resist was passed through a 0.01 micrometer polytetrafluoroethylene filter and coated on a 200 millimeter silicon wafer already coated with an organic underlayer (Dow Chemical AR9-900) to yield a 60 nanometer thick film. The resist was then soft baked at 90° C. for 60 seconds and exposed using an EUV Micro Exposure Tool (eMET; EUV radiation, 13.4 nanometers) at increasing dose. A contrast curve is generated after a post-exposure bake at 90° C. for 60 seconds followed by a 0.26 N tetramethylammonium hydroxide treatment for 60 seconds. The $E_o$ values for several resist samples are listed in Table 4.

For lithographic processing, each resist was processed as follows. The photoresist was spin coated using a TEL ACT-8 (Tokyo Electron) coating track or similar equipment onto a 200 millimeter silicon wafer having an organic underlayer (Dow Chemical AR9-900) and baked at 90° C. for 60 seconds to form a resist film of about 60 nanometers in thickness. The resulting photoresist layer was exposed through a patterned mask to image 22 to 26 nanometer 1:1 line/space features (eMET; EUV radiation, 13.4 nanometers). The exposed wafers were post-exposure baked at 90° C. for 60 seconds and developed with 0.26 N aqueous tetramethylammonium hydroxide developer solutions to form a positive-tone photoresist pattern. The 1:1 line space patterns for resists 14-16 are shown in FIG. 1. Resist 15 (FIG. 1a) shows a minimum resolution of 24 nanometers with a line width roughness (LWR) of 8.1 nanometers. Resist 16 (FIG. 1b) showed 22 nanometer resolution capability with a minimum LWR of 5.87 nanometers, and resist 14 (FIG. 1c) exhibited 22 nanometer resolution with an LWR of 8.6 nanometers. Sizing dose ($E_{size}$) for each of the resists is listed in Table 4. The process window comparison of these resists is shown in FIGS. 2-7.

Photoresist 1. A positive-tone photoresist composition was prepared by combining 8.26 grams of a 10 weight percent solution in cyclohexanone of the polymer pBEBA-2,4-DBP-CHVE (100%), (5.5 kDa), 8.26 grams of a 2 weight percent solution of 5-phenyl-5H-dibenzo[b,d]thiophenium 3-hydroxyadamantane-acetoxy-1,1,2,2-tetrafluorobutane-1-sulfonate (PDBT-ADOH) in cyclohexanone, 1.48 grams of a 0.5 weight percent solution of tetrahydroxy isopropyl diamine (THIPDA; CAS Reg. No. 102-60-3) in cyclohexanone, 0.165 gram of a 0.5 weight percent solution in cyclohexanone of a fluorinated surfactant (OMNOVA™ PF656) and 21.8 grams of cyclohexanone. The sample was tested for water contact angle and strip. Results are presented in Table 1.

Photoresist 2. A 60 nanometer thick film was coated with a 2.5% solids solution. 3.74 grams of 10% solution of the polymer pBEBA-2,4-DBP-CHVE (60%) (6.02 kDa) in cyclohexanone was further diluted with 11.2 grams cyclohexanone and 0.075 gram of a 0.5 weight percent solution in cyclohexanone of a fluorinated surfactant (OMNOVA™ PF656). The sample was tested for water contact angle and strip. Results are presented in Table 1. The resist when coated on bare silicon exhibited poor adhesion to the substrate but adhered well when coated on AR9-900.

Photoresist 3. A 60 nanometer thick film was coated with a 2.5% solids solution. 0.25 gram of the polymer pBEBA-2,4-DBP-CHVE (30%) (6.03 kDa) was dissolved in 9.7 grams cyclohexanone and 0.05 grams of a 0.5 weight percent solution in cyclohexanone of a fluorinated surfactant (OMNOVA™ PF656) was added. The sample was tested for water contact angle and strip. Results are presented in Table 1.

Photoresist 4. A 60 nanometer thick film was coated with a 2.5% solids solution. 0.3 gram of the polymer pBEBA-2,4-DBP-CHVE (10%) (5.20 kDa) was dissolved in 11.64 gram cyclohexanone and 0.06 gram of a 0.5 weight percent solution in cyclohexanone of a fluorinated surfactant (OMNOVA™ PF656) was added. The sample was tested for film quality and water contact angle. Results are presented in Table 1.

Photoresist 5. A 60 nanometer thick film was coated with a 2.5% solids solution. 0.3 gram of the polymer pBEBA-2,4-DBP (0%) (14.4 kDa) was dissolved in 11.64 grams cyclohexanone and 0.06 gram of a 0.5 weight percent solution in cyclohexanone of a fluorinated surfactant (OMNOVA™ PF656) was added. The sample was tested for film quality and water contact angle. Results are presented in Table 1.

In Table 1, "% protection" refers to the percent protection of phenol groups in the polymer used in the photoresist; "Strip (Å)" refers to less in film thickness caused by the strip test described above; "Comments" describe the ability of the photoresist layer to be wetted by the developer; "Water contact angle (°)" refers to the contact angle of photoresist solution on a bare silicon substrate; and "n/k@248 nm" refers to the ratio of optical constants n and k, measured at 248 nanometers using a Woolam VUV-VASE ellipsometer.

TABLE 1

| Photoresist No. | % protection | Strip (Å) | Comments | Water contact angle (°) | n/k @ 248 nm |
|---|---|---|---|---|---|
| 1 | 100 | — | Poor developer wet ability | 86° | 1.66/0.27 |
| 2 | 60 | — | Poor developer wet ability | 86° | 1.65/0.28 |
| 3 | 30 | 0 | Developer wet ability OK | 83° | 1.87/0.35 |
| 4 | 10 | — | Poor film quality | 72° | — |
| 5 | 0 | 20 | Developer wet ability OK | 70° | — |

Photoresist 6. 3.01 grams of a 10% solution of pBEBA-2,4-DBP-CHVE (30%) in cyclohexanone were dissolved in 3.1 grams of a 2 weight percent solution of 5-phenyl-5H-dibenzo[b,d]thiophenium 3-hydroxyadamantane-acetoxy-1,1,2,2-tetrafluorobutane-1-sulfonate in cyclohexanone, 2.41 grams of a 0.5 weight percent solution of tetrahydroxy isopropyl diamine in cyclohexanone, 0.07 gram of a 0.5 weight percent solution in cyclohexanone of a fluorinated surfactant (OMNOVA™ PF656) and 7.68 grams of cyclohexanone.

Photoresist 7. 3.12 grams of a 10% solution of pBEBA-2,4-DBP-CHVE (30%) in cyclohexanone were dissolved in 3.11 grams of a 2 weight percent solution of 5-phenyl-5H-dibenzo[b,d]thiophenium 3-hydroxyadamantane-acetoxy-1,1,2,2-tetrafluorobutane-1-sulfonate in cyclohexanone, 0.55 gram of a 0.5 weight percent solution of tert-butyl-4-hydroxy-1-piperidinecarboxylate in cyclohexanone, 0.06 gram of a 0.5 weight percent solution in cyclohexanone of a fluorinated surfactant (OMNOVA™ PF656) and 8.2 grams of cyclohexanone.

Photoresist 8. 3.02 grams of a 10% solution of pBEBA-2,4-DBP-CHVE (30%) in cyclohexanone were dissolved in 3.02 grams of a 2 weight percent solution of 5-phenyl-5H-dibenzo[b,d]thiophenium 3-hydroxyadamantane-acetoxy-1,1,2,2-tetrafluorobutane-1-sulfonate in cyclohexanone, 2.417 grams of a 0.5 weight percent solution of tert-butyl-4-hydroxy-1-piperidine carboxylate in cyclohexanone, 0.06 gram of a 0.5 weight percent solution in cyclohexanone of a fluorinated surfactant (OMNOVA™ PF656) and 6.5 grams of cyclohexanone.

Photoresist 9. 6.17 grams of a 10 weight percent solution in cyclohexanone of the polymer pBEBA-2,4-DBP-CHVE (30%) was combined with 6.16 gram of a 2 weight percent solution of 5-phenyl-5H-dibenzo[b,d]thiophenium 3-hydroxyadamantane-acetoxy-1,1,2,2-tetrafluorobutane-1-sulfonate in cyclohexanone, 2.23 grams of a 0.5 weight percent solution of tert-butyl-4-hydroxy-1-piperidine carboxylate in cyclohexanone, 0.14 gram of a 0.5 weight percent solution in cyclohexanone of a fluorinated surfactant (OMNOVA™ PF656), 0.79 gram of cyclohexanone, and 14.62 grams of propylene glycol monomethyl ether acetate.

In Table 2, "QB type" refers to the identity of the quencher base; "QB amount (wt %)" is the weight percent of quencher base based on the weight of polymer in the photoresist composition; and "EUV $E_o$ (mJ/cm$^2$)" is the dose-to-clear value, expressed in units of millijoules/centimeter$^2$. The Table 2 results demonstrate the effect of quencher base loading on photospeed.

TABLE 2

| Photoresist No. | QB type | QB amount (% of solids) | EUV $E_o$ (mJ/cm$^2$) |
|---|---|---|---|
| 6 | tetrahydroxy isopropyl diamine | 3.22 | >12 |
| 7 | tert-butyl-4-hydroxy-1-piperidine carboxylate | 0.744 | <2 |
| 8 | tert-butyl-4-hydroxy-1-piperidine carboxylate | 1.488 | 4.2 |
| 9 | tert-butyl-4-hydroxy-1-piperidine carboxylate | 3.22 | 5.5 |

The 100% deprotected polymer exhibited a high strip of 20 Å. This led to less inhibition and a high $R_{min}$. In an effort to lower strip, the polymer was formulated as positive tone resists using different bulkier photoacid generators. The photoresist compositions follow, and the results are summarized in Table 3.

Photoresist 10. A 60 nanometer film was coated with a 2.5% solids solution. 0.3 gram of pBEBA-2,4-DBP (0%) (14.4 kDa) was dissolved in 11.64 gram cyclohexanone and 0.06 gram of a 0.5 weight percent solution in cyclohexanone of a fluorinated surfactant (OMNOVA™ PF656) was added to it. The sample was tested for strip using tetramethylammonium hydroxide.

Photoresist 11. A positive-tone photoresist composition was prepared by combining 4.13 grams of a 10 weight percent solution in cyclohexanone of pBEBA-2,4-DBP (0%) (14.4 kDa), 4.2 grams of a 2 weight percent solution of 5-phenyl-5H-dibenzo[b,d]thiophenium 3-hydroxyadamantane-acetoxy-1,1,2,2-tetrafluorobutane-1-sulfonate (PDBT-ADOH) in cyclohexanone, 1.48 gram of a 0.5 weight percent solution of tert-butyl-4-hydroxy-1-piperidine carboxylate in cyclohexanone, 0.08 gram of a 0.5 weight percent solution in cyclohexanone of a fluorinated surfactant (OMNOVA™ PF656), and 10.909 grams of cyclohexanone. The preparation of PDBT-ADOH is described in Example 1 of U.S. Patent Application Ser. No. 61/701,588, filed Sep. 15, 2012.

Photoresist 12. A positive-tone photoresist composition was prepared by combining 3.6 grams of a 10 weight percent solution in cyclohexanone of pBEBA-2,4-DBP (0%) (14.4 kDa), 6.59 grams of a 2 weight percent solution of 5-(4-(2-(1-ethylcyclopentyloxy)-2-oxoethoxy)-3,5-dimethylphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate (ECP PDBT-DHC in Table 3), 1.35 grams of a 0.5 weight percent solution of tert-butyl-4-hydroxy-1-piperidine carboxylate in cyclohexanone, 0.07 grams of a 0.5 weight percent solution in cyclohexanone of a fluorinated surfactant (OMNOVA™ PF656), and 8.42 grams of cyclohexanone. The preparation of ECP PDBT-DHC is described in Example 7 of U.S. Patent Application Ser. No. 61/701,588, filed Sep. 15, 2012.

Photoresist 13. A positive-tone photoresist composition was prepared by combining 7.25 grams of a 10 weight percent solution in cyclohexanone of pBEBA-2,4-DBP (0%) ($M_w$: 12.2 kDa), 13.47 grams of a 2 weight percent solution of 5-(4-(2-(1-ethylcyclopentyloxy)-2-oxoethoxy)-3,5-dimethylphenyl)-5H-dibenzo[b,d]thiophenium 3-hydroxyadamantane-acetoxy-1,1,2,2-tetrafluorobutane-1-sulfonate (ECP PDBT-ADOH; equivalent to 20% PDBT-ADOH) in cyclohexanone, 3.49 grams of a 0.5 weight percent solution of tert-butyl-4-hydroxy-1-piperidine carboxylate in cyclohexanone, 0.19 gram of a 0.5 weight percent solution in cyclohexanone of a fluorinated surfactant (OMNOVA™ PF656), and 1.27 grams of cyclohexanone and 24.39 grams of propylene glycol monomethyl ether acetate. The preparation of ECP PDBT-ADOH is described in Example 6 of U.S. Patent Application Ser. No. 61/701,588, filed Sep. 15, 2012.

Photoresist 14. A positive-tone photoresist composition was prepared by combining 0.74 grams of pBEBA-2,4-DBP (0%) ($M_w$ 12.2 kDa),12.53 grams of a 2 weight percent solution of 5-(4-(2-(1-ethylcyclopentyloxy)-2-oxoethoxy)-3,5-dimethylphenyl)-5H-dibenzo[b,d]thiophenium 4-(3-hydroxy-adamantane-1-carbonyloxy)-1,1,2,2-tetrafluorobutane sulfonate (ECP PDBT-ADOH) in ethyl lactate, 2.64 grams of a 0.5 weight percent solution of tert-butyl-4-hydroxy-1-piperidine carboxylate in cyclohexanone, 0.15 gram of a 0.5 weight percent solution in cyclohexanone of a fluorinated surfactant (OMNOVA™ PF656), 14.5 grams of cyclohexanone, and 19.5 grams of propylene glycol monomethyl ether acetate.

In Table 3, "PAG type" refers to the identity of the photoacid generator; "ECP PDBT-DHC" is 5-(4-(2-(1-ethylcyclopentyloxy)-2-oxoethoxy)-3,5-dimethylphenyl)-5H-dibenzo[b,d]thiophenium 4-((4R)-4-((8R,9S,10S,13R,14S,17R)-10,13-dimethyl-3,7,12-trioxohexadecahydro-1H-cyclopenta[a]phenanthren-17-yl)pentanoyloxy)-1,1,2,2-tetrafluorobutane-1-sulfonate; ECP PDBT-ADOH is 5-(4-(2-(1-ethylcyclopentyloxy)-2-oxoethoxy)-3,5-dimethylphenyl)-5H-dibenzo[b,d]thiophenium 4-(3-hydroxy-adamantane-1-carbonyloxy)-1,1,2,2-tetrafluorobutane sulfonate. "PAG amount (wt %)" refers to the weight percent of photoacid generator based on the weight of polymer in the photoresist composition. The Table 3 results demonstrate the effect of PAG hydrophobicity on strip. The more hydrophobic PAG led to higher inhibition towards developer penetrability.

TABLE 3

| Photoresist No. | PAG type | PAG amount (% of solids) | Strip (Å) |
|---|---|---|---|
| 10 | none | 0% | 20 |
| 11 | PDBT-ADOH | 16.52% | 50 |
| 12 | ECP PDBT-DHC | 26.37% | 35 |
| 13 | ECP PDBT-ADOH | 21.55% | 12 |
| 14 | ECP PDBT-ADOH | 25.08% | 17 |

Select photoresist compositions were tested at the Albany eMET for line and space.

Photoresist 15. A positive-tone photoresist composition was prepared by combining 6.17 grams of 10 weight percent solution in cyclohexanone of polymer pBEBA-2,4-DBP-CHVE (30%) ($M_w$ 9.5 kDa), 6.16 grams of a 2 weight percent solution of 5-phenyl-dibenzothiophenium 4-(3-hydroxy-adamantane-1-carbonyloxy)-1,1,2,2-tetrafluorobutane sulfonate in cyclohexanone, 2.23 grams of a 0.5 weight percent solution of tert-butyl-4-hydroxy-1-piperidine carboxylate in cyclohexanone, 0.14 gram of a 0.5 weight percent solution in cyclohexanone of a fluorinated surfactant (OMNOVA™ PF656), 0.79 gram of cyclohexanone, and 14.62 grams of propylene glycol monomethyl ether acetate.

Photoresist 16. A positive-tone photoresist composition was prepared by combining 0.77 grams of pBEBA-2,4-DBP (0%) ($M_w$ 12.2 kDa), 10.8 grams of a 2 weight percent solution of 5-(4-(2-(1-ethylcyclopentyloxy)-2-oxoethoxy)-3,5-dimethylphenyl)-5H-dibenzo[b,d]thiophenium 4-(3-hydroxy-adamantane-1-carbonyloxy)-1,1,2,2-tetrafluorobutane sulfonate in ethyl lactate, 2.8 grams of a 0.5 weight percent solution of ten-butyl-4-hydroxy-1-piperidine carboxylate in cyclohexanone, 0.154 gram of a 0.5 weight percent solution in cyclohexanone of a fluorinated surfactant (OMNOVA™ PF656), 6.028 gram of cyclohexanone, and 19.65 g of propylene glycol monomethyl ether acetate.

In Table 4, "$E_{size}$ or $E_s$ (mJ/cm$^2$)" is the amount of exposure energy required to produce the proper dimension of the resist feature and is expressed in millijoules/centimeter$^2$; "LWR", expressed in nanometers (nm), is the line width roughness, calculated as 3 σ (three standard deviations) from the feature edge (as viewed top down) from a smooth ideal shape at the stated critical dimension (CD) and at best focus and at the stated sizing energy ($E_{size}$). FIG. 1 presents line space images for (a) Photoresist 15 at 24 nanometer critical dimension, (b) Photoresist 16 at 22 nanometer critical dimension, and (c) Photoresist 14 at 22 nanometer critical dimension. FIGS. 2-7 are each plots of Critical Dimension (CD (micrometers)) versus focus (micrometers) as a function of dose (millijoules/centimeter$^2$).

The results of the line space experiments demonstrate that resist containing backbone cleavable polymers are able to resolve sub-26 nanometer lines with a minimum LWR of 5.7 (Photoresist 16).

TABLE 4

| Photoresist No. | % protection | Strip (Å) | EUV $E_o$ (mJ/cm$^2$) | EUV $E_{size}$ (mJ/cm$^2$) | LWR |
|---|---|---|---|---|---|
| 15 | 30 | 35 | 4.2 | 13.4: 24 nm CD | 8.1 |
| 16 | 0 | 12 | 7.8 | 26.4: 22 nm CD | 5.7 |
| 14 | 0 | 17 | 6.6 | 19.6: 22 nm CD | 8.6 |

Photoresist 17. A positive-tone photoresist composition was prepared by combining 19.79 grams of a 10% solution of terpolymer (PPMA/a-GBLMA/DiHFA; synthesis described in Example 23 of U.S. Patent Application Ser. No. 61/701, 588, filed Sep. 15, 2012) in ethyl lactate, 42.75 grams of a 2 weight percent solution of 5-(4-(2-(1-ethylcyclopentyloxy)-2-oxoethoxy)-3,5-dimethylphenyl)-5H-dibenzo[b,d]thiophenium 4-(3-hydroxy-adamantane-1-carbonyloxy)-1,1,2,2-tetrafluorobutane sulfonate in ethyl lactate, 3.996 grams of a 0.5 weight percent solution of tetrahydroxy isopropyl diamine in ethyl lactate, 0.4 gram of a 0.5 weight percent solution in ethyl lactate of a fluorinated surfactant (OMNOVA™ PF656), 21.21 grams of ethyl lactate, and 36.63 grams of 2-hydroxyisobutyric acid methyl ester. The formulated resist was passed through a 0.01 micrometer polytetrafluoroethylene filter. The photoresist was spin coated onto a silicon wafer, soft baked at 110° C. for 90 seconds to remove carrier solvent and exposed through a photomask to EUV radiation. The imaged resist layer was then post-exposure baked at 100° C. for 60 seconds and developed with 0.26 N tetramethylammonium hydroxide for 30 seconds.

Figure 8:
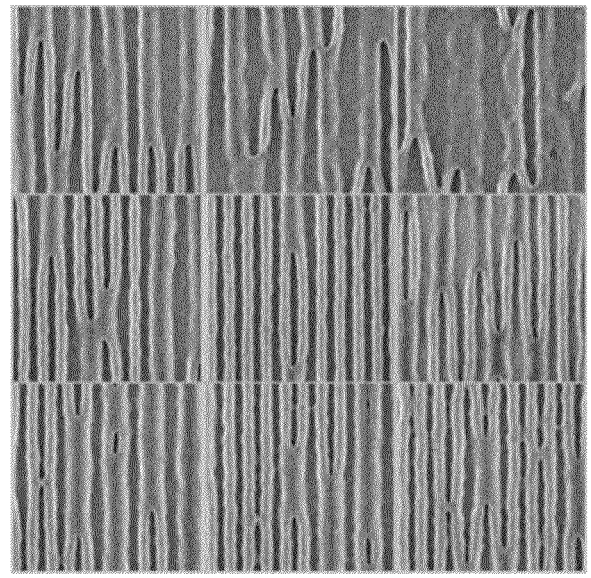
FIG. 8 shows the top down images obtained by printing 22 nanometer features on the comparative methacrylate-based, photoacid generator-containing EUV Photoresist 17 as a function of dose at 5% increments (15.7 mJ/cm$^2$, 16.5 mJ/cm$^2$, and 17.3 mJ/cm$^2$, from bottom to top) on the y-axis and focus at 50 nanometer increments (50, 100, and 150 nanometers) on the x-axis. The center square corresponds to best focus and best dose.
Figure 9:
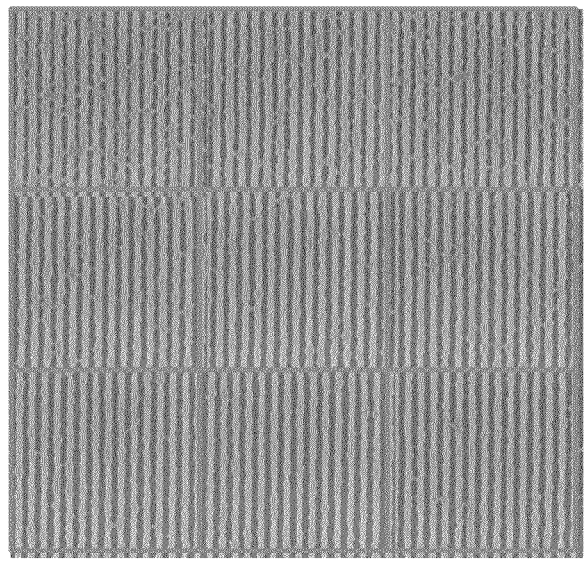
FIG. 9 shows the top down images obtained by printing 22 nanometer features on the inventive polyacetal-based, photoacid generator-containing EUV Photoresist 16 as a function of dose at 5% increments (25.2 mJ/cm$^2$, 26.4 mJ/cm$^2$, and 27.6 mJ/cm$^2$, from bottom to top) on the y-axis and focus at 50 nanometer increments (3100, 3150, and 3200 nanometers) on the x-axis. The center square corresponds to best focus and best dose.

The imaged Photoresist 17 layer was generated on the Lawrence Berkeley National Laboratory (LBNL) eMET. The imaged Photoresist 16 layer was generated on the Albany eMET. Twenty-two nanometer critical dimension images for Photoresist 16 and Photoresist 17 at best focus and best dose are shown in FIGS. 8 and 9, respectively. Results are presented in Table 5. It is clear from the data shown in FIGS. 8-9 and data listed in table 5 that the inventive polyacetal-based, photoacid generator-containing EUV Photoresist 16 exhibits superior resolution capability, line width roughness (LWR), and process window at 22 nanometer critical dimension (FIG. 9), relative to the poly(methacrylate)-based, photoacid generator-containing Photoresist 17 (FIG. 8), where severe pattern collapse occurs at 22 nanometer critical dimension, thereby making LWR and E1 calculations impossible. The various lithographic properties are further listed in Table 5.

TABLE 5

| Photoresist No. | LWR | EL (exposure latitude) 100 nm DoF |
|---|---|---|
| 17 | LWR calculations not performed due to severe pattern collapse. | No EL due to severe PC |
| 16 | 5.7 | 4.8 |

The invention claimed is:
1. A photoresist composition comprising:
a polymer comprising a plurality of repeat units having the structure

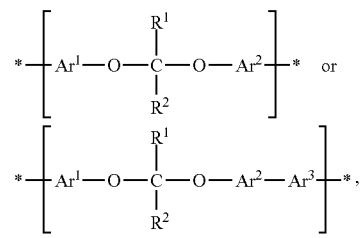

wherein each occurrence of $R^1$ and $R^2$ is independently hydrogen, unsubstituted or substituted $C_{1-18}$ linear or branched alkyl, unsubstituted or substituted $C_{3-18}$ cycloalkyl, unsubstituted or substituted $C_{6-18}$ aryl, or unsubstituted or substituted $C_{3-18}$ heteroaryl; and $R^1$ and $R^2$ are optionally covalently linked to each other to form a ring that includes —$R^1$—C—$R^2$—; each occurrence of $Ar^1$, $Ar^2$, and $Ar^3$ is independently an unsubstituted or substituted $C_{6-18}$ arylene, or unsubstituted or substituted $C_{3-18}$ heteroarylene; wherein at least one occurrence of $R^1$, $R^2$, $Ar^1$, $Ar^2$, and $Ar^3$ is substituted with at least one functional group selected from hydroxyl, acetal, ketal, ester, and lactone; and
a photoactive component selected from photoacid generators, photobase generators, photoinitiators, and combinations thereof.

2. The photoresist composition of claim 1, wherein at least one occurrence of $R^1$, $R^2$, $Ar^1$, $Ar^2$, or $Ar^3$ is substituted with at least one hydroxyl.

3. The photoresist composition of claim 1, wherein at least one occurrence of $R^1$, $R^2$, $Ar^1$, $Ar^2$, or $Ar^3$ is substituted with at least one tertiary ester.

4. The photoresist composition of claim 1, wherein each occurrence of $Ar^1$, $Ar^2$, and $Ar^3$ is independently 1,3-phenylene or 1,4-phenylene.

5. The photoresist composition of claim 1, wherein $Ar^1$ and $Ar^2$ are not covalently linked with one another to form a ring structure that includes —$Ar^1$—O—C—O—$Ar^2$—.

6. The photoresist composition of claim 1, wherein
each occurrence of $R^1$ is hydrogen; and
each occurrence of $R^2$ is unsubstituted or substituted phenyl.

7. The photoresist composition of claim 1, wherein
each occurrence of $R^1$ is hydrogen; and
each occurrence of $R^2$ is phenyl, hydroxyphenyl, ortho-methoxyphenyl, meta-methoxyphenyl, or para-methoxyphenyl.

8. A coated substrate, comprising: (a) a substrate having one or more layers to be patterned on a surface thereof; and (b) a layer of a photoresist composition of claim 1 over the one or more layers to be patterned.

9. A method of forming an electronic device, comprising:
(a) applying a layer of a photoresist composition of claim 1 on a substrate; (b) patternwise exposing the photoresist composition layer to activating radiation; (c) developing the exposed photoresist composition layer to provide a resist relief image, and (d) etching the resist relief pattern into the underlying substrate.

\* \* \* \* \*